United States Patent
Sachdev et al.

(10) Patent No.: US 8,072,797 B2
(45) Date of Patent: Dec. 6, 2011

(54) SRAM CELL WITHOUT DEDICATED ACCESS TRANSISTORS

(75) Inventors: Manoj Sachdev, Waterloo (CA); David Rennie, Waterloo (CA)

(73) Assignee: Certichip Inc., Waterloo (CA)

( * ) Notice: Subject to any disclaimer, the term of this patent is extended or adjusted under 35 U.S.C. 154(b) by 0 days.

(21) Appl. No.: 12/494,908

(22) Filed: Jun. 30, 2009

(65) Prior Publication Data

US 2010/0110773 A1 May 6, 2010

Related U.S. Application Data

(60) Provisional application No. 61/129,570, filed on Jul. 7, 2008, provisional application No. 61/136,659, filed on Sep. 23, 2008, provisional application No. 61/193,503, filed on Dec. 4, 2008.

(51) Int. Cl.
*G11C 11/00* (2006.01)

(52) U.S. Cl. .................. 365/154; 365/174; 365/188

(58) Field of Classification Search .................. 365/154, 365/174, 188

See application file for complete search history.

(56) References Cited

U.S. PATENT DOCUMENTS

| | | | | |
|---|---|---|---|---|
| 5,216,630 A * | 6/1993 | Nakase | ........................... | 365/155 |
| 5,338,963 A * | 8/1994 | Klaasen et al. | ............... | 257/376 |
| 5,684,735 A * | 11/1997 | Kim | .............................. | 365/149 |
| 5,805,496 A * | 9/1998 | Batson et al. | .................. | 365/154 |
| 5,838,606 A * | 11/1998 | Blankenship et al. | ........ | 365/156 |
| 5,923,593 A * | 7/1999 | Hsu et al. | .................. | 365/189.04 |
| 6,373,745 B2 * | 4/2002 | Saito et al. | ..................... | 365/174 |
| 6,628,551 B2 * | 9/2003 | Jain | ................................ | 365/187 |
| 6,654,275 B2 * | 11/2003 | Forbes | ......................... | 365/154 |
| 6,711,051 B1 * | 3/2004 | Poplevine et al. | ............ | 365/154 |
| 6,738,283 B2 * | 5/2004 | Kasai et al. | .................... | 365/154 |
| 6,751,111 B2 * | 6/2004 | Foss et al. | .................. | 365/49.11 |
| 7,009,871 B1 * | 3/2006 | Kawasumi | .................... | 365/154 |
| 7,088,606 B2 * | 8/2006 | Turner | .......................... | 365/149 |
| 7,088,607 B2 * | 8/2006 | Matsuzawa et al. | ......... | 365/153 |
| 7,492,628 B2 * | 2/2009 | Chuang et al. | ................ | 365/154 |
| 7,643,329 B2 * | 1/2010 | Sachdev et al. | ............... | 365/154 |
| 7,733,688 B2 * | 6/2010 | Giraud et al. | ................. | 365/154 |
| 7,764,535 B2 * | 7/2010 | Nguyen | ........................ | 365/154 |

* cited by examiner

*Primary Examiner* — Viet Nguyen
(74) *Attorney, Agent, or Firm* — Gowling Lafleur Henderson LLP

(57) ABSTRACT

A Static Random Access Memory (SRAM) cell without dedicated access transistors is described. The SRAM cell comprises a plurality of transistors configured to provide at least a pair of storage nodes for storing complementary logic values represented by corresponding voltages. The transistors comprise at least one bitline transistor, at least on wordline transistor and at least two supply transistors. The bitline transistor is configured to selectively couple one of the storage nodes to at least one corresponding bitline, the bitline for being shared by SRAM cells in one of a common row or column. The wordline transistor is configured to selectively couple another of the storage nodes to at least one corresponding wordline, the wordline for being shared by SRAM cells in the other of the common row or column. The supply transistors are configured to selectively couple corresponding ones of the storage nodes to a supply voltage.

21 Claims, 23 Drawing Sheets

SRAM CELL WITHOUT DEDICATED ACCESS TRANSISTORS

The present invention relates generally to Static Random Access Memory (SRAM) cells, and specifically to SRAM memory cells having improved robustness and reduced size. This application claims priority from U.S. Provisional Patent Application No. 61/129,570, filed Jul. 7, 2008, U.S. Provisional Patent Application No. 61/136,659, filed Sep. 23, 2008, and U.S. Provisional Patent Application No. 61/193,503, filed Dec. 4, 2008.

BACKGROUND OF THE INVENTION

Static Random Access Memory (SRAM) cells are one of the most popular ways to store data in electronic systems. Accordingly, embedded SRAM cells are vital building blocks in integrated circuits. SRAM cells are popular to implement because they provide high operational speed, robust data storage, and ease of integration.

SRAM arrays often occupy a significantly large portion of a chip's die area, making an SRAM cell an important block in terms of area, yield, reliability and power consumption. With increasing demand for highly integrated System on Chip (SoC) design, improving various aspects of embedded SRAM cells has received a significant interest.

The most popular SRAM cell configuration is a six transistor (6T) SRAM cell, due largely to its high operational speed and robust data storage. Referring to FIG. 1a, the 6T SRAM cell is illustrated. The 6T SRAM cell comprises four transistors configured to provide a pair of complementary storage nodes and two dedicated access transistors, each configured to access a corresponding one of the storage nodes.

Accordingly, a four transistor (4T) SRAM cell has been developed. Referring to FIG. 1b, the 4T SRAM cell is illustrated. The 4T SRAM cell comprises two drive transistors configured to provide a pair of complementary storage nodes and two dedicated access transistors, each configured to access a corresponding one of the storage nodes. Although the 4T SRAM cell reduces the space required to implement the SRAM cell, using only two drive transistors results in poor stability. Specifically, in this configuration the stability of the SRAM cell depends on the relative leakage through dedicated access and driver transistors. Therefore, threshold voltage fluctuations of transistors can affect the stability of the cell significantly. In extreme situations, the SRAM cell may lose its data.

Although the 6T SRAM cell is the most common memory cell, other cells have been created with the goal of higher stability and robustness. For example, referring to FIG. 10, a prior art ten-transistor (10T) soft error robust (SER) SRAM cell is shown. When ionizing radiation consisting of energetic cosmic neutrons and alpha particles strike an SRAM cell they generate a large number of electron hole pairs. Depending on the location of the particle strike, the deposited charge may be collected by a node in the SRAM cell. If sufficient charge is collected the SRAM cell can switch its logical state, which is called a soft error. Accordingly, the illustrated circuit comprises eight transistors configured to provide two pairs of complementary storage nodes. The redundant storage nodes provide the 10T SRAM cell with a robustness to soft errors. In addition to the core eight transistors which create the robust storage cell, two dedicated access transistors are provided to couple two of the four nodes in the storage cell to a pair of bitlines (BL and BLB).

Yet further, referring to FIG. 16, a state-of-the-art dual-interlocking storage cell (DICE cell) DICE cell also provides robustness to soft errors. Data is stored on multiple nodes and the DICE cell is immune to single node upsets. However, the DICE cell requires twice as many transistors to implement as the standard 6T SRAM circuit, making it expensive in terms of both area and power.

Irrespective of the storage cell which holds the data it is desirable to implement an SRAM cell with a minimal number of transistors while maintaining stability at the storage nodes.

SUMMARY OF THE INVENTION

A new SRAM cell configuration is introduced. The SRAM cell configuration allows for a variety of storage cells to be accessed with fewer transistors compared with traditional implementations by allowing for data to be written into and read from a storage cell without requiring the use of dedicated access transistors.

In accordance with an aspect of the present invention there is provided a Static Random Access Memory (SRAM) cell comprising a plurality of transistors configured to provide at least a pair of storage nodes for storing complementary logic values represented by corresponding voltages, the transistors comprising: at least one bitline transistor configured to selectively couple one of the storage nodes to at least one corresponding bitline, the bitline for being shared by SRAM cells in one of a common row or column; at least one wordline transistor configured to selectively couple another of the storage nodes to at least one corresponding wordline, the wordline for being shared by SRAM cells in the other of the common row or column; and at least two supply transistors configured to selectively couple corresponding ones of the storage nodes to a supply voltage; the bitline transistor being further configured to actively maintain a logic value at the one of the storage nodes and the wordline transistor being further configured to actively maintain a complementary logic value at the other of the storage nodes.

In accordance with an aspect of the present invention there is provided a Static Random Access Memory (SRAM) cell comprising a plurality of transistors configured to provide four storage nodes configured as two pairs of complementary storage nodes for storing complementary logic values represented by corresponding voltages, the transistors comprising: two bitline transistors configured to selectively couple a first pair of complementary storage nodes to corresponding bitlines, the bitlines for being shared by SRAM cells in one of a common row or column; two wordline transistors configured to selectively couple a second pair of complementary storage nodes to the corresponding wordlines, the wordlines being shared by SRAM cells in the other of the common row or column; and four supply transistors configured to selectively couple the four storage nodes to a power supply.

In accordance with an aspect of the present invention there is provided a Static Random Access Memory (SRAM) cell comprising a plurality of transistors configured to provide four complementary storage nodes as two pairs of complementary storage nodes for storing complementary logic values represented by corresponding voltages, the transistors comprising: two bitline transistors configured to selectively couple two complementary storage nodes to corresponding bitlines, the bitlines for being shared by SRAM cells in one of a common row or column; four wordline transistors configured to selectively couple the remaining two complementary storage nodes to corresponding wordlines, the wordlines shared by SRAM cells in the other of a common row or column; and the two supply transistors coupling corresponding ones of the two complementary storage nodes to the supply voltage.

BRIEF DESCRIPTION OF THE DRAWINGS

Embodiments of the present invention will now be described by way of example only with reference to the following drawings in which:

FIG. 26a is schematic diagram of a 10T DICE SRAM cell having a read assist circuit in accordance with an embodiment of the invention;
FIG. 26b is schematic diagram of a 10T DICE SRAM cell having an alternate read assist circuit to that shown in FIG. 26a;
FIG. 27a is a flow chart for the read operation on the cell illustrated in FIG. 26a;

DETAILED DESCRIPTION OF THE PREFERRED EMBODIMENTS

For convenience, like structures in drawings will be referenced by like numerals in the description. Memory cells are described in which the number of transistors have been reduced in comparison to traditional memory cells by providing direct access to the storage node via the bitlines and wordlines, without requiring dedicated access transistors. The following describes embodiments of memory cells using three different storage cell configurations: the back-to-back inverter storage cell (4T SRAM), the 8T robust storage cell and the 8T DICE storage cell.

Figure 1A:
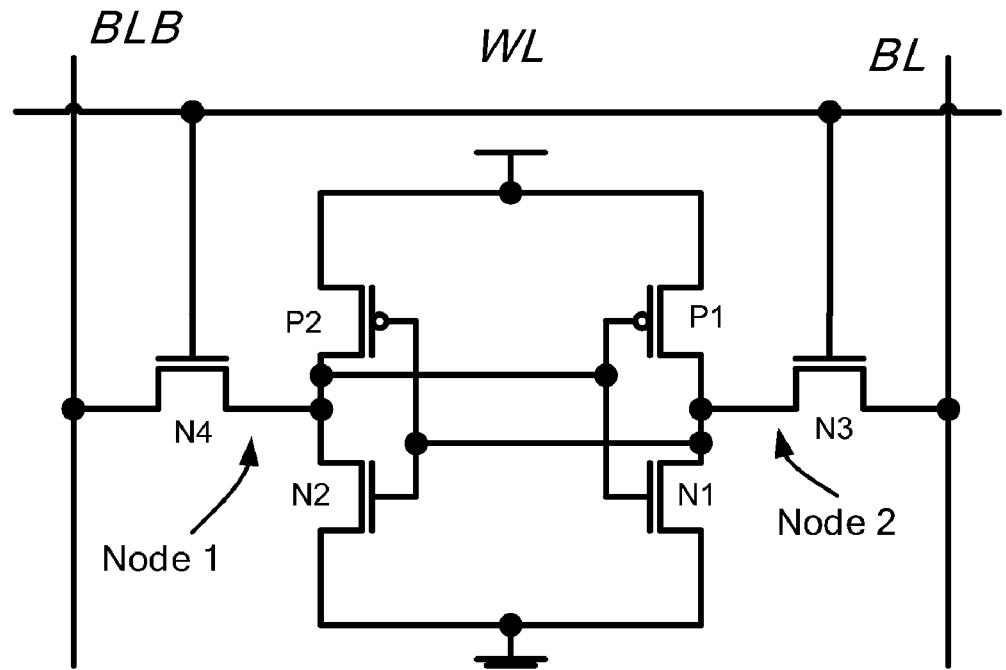
FIG. 1a is a schematic diagram of a prior art 6T SRAM cell.
Figure 1B:
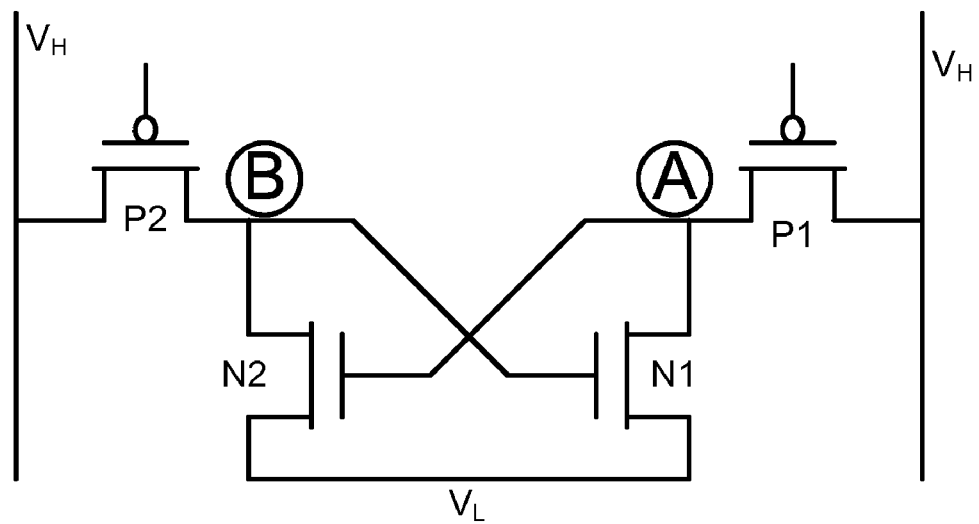
FIG. 1b is a schematic diagram of a prior art 4T SRAM cell.
Figure 2:
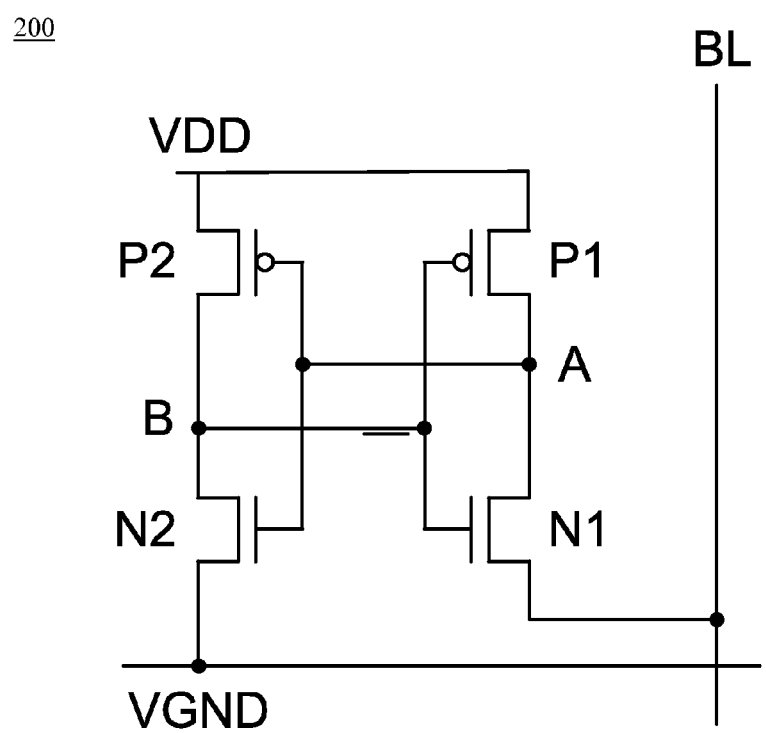
FIG. 2 is a schematic diagram of a 4T SRAM cell in accordance with an embodiment of the present invention.

Referring to FIG. 2, a 4T SRAM cell in accordance with an embodiment of the present invention is illustrated generally by the numeral 200. The 4T SRAM cell 200 comprises two re-channel transistors N1 and N2, two p-channel transistors P1 and P2 and two internal nodes A and B.

Transistors N1 and P1 and N2 and P2 are connected in a cross-coupled latch configuration. The source terminal of transistor N1 is connected to a bitline BL while the source terminal of transistor N2 is connected to a wordline WL. The source terminals of transistors P1 and P2 are connected to a nominal supply voltage VDD. Because transistors N1 and N2 are coupled to the bitline BL and wordline WL, respectively, they will be referred as line transistors. Because transistors P1 and P2 are coupled to the supply voltage VDD, the will be referred to as supply transistors. In the present embodiment, VDD is 1.0V. In steady state, the voltage on the wordline WL and the voltage ($V_{BL}$) of the bitline are kept at a low voltage $V_L$. In the present embodiment, $V_L$ is approximately 200 mV.

Therefore, the SRAM cell 200 is able to retain logic data as long as it is powered. Further, transistor N1 also acts as an access transistor, connecting the internal node A to the bitline BL if the gate-to-source voltage $V_{GS}$ of transistor N1 is raised above its threshold voltage $V_T$.

Figure 3:
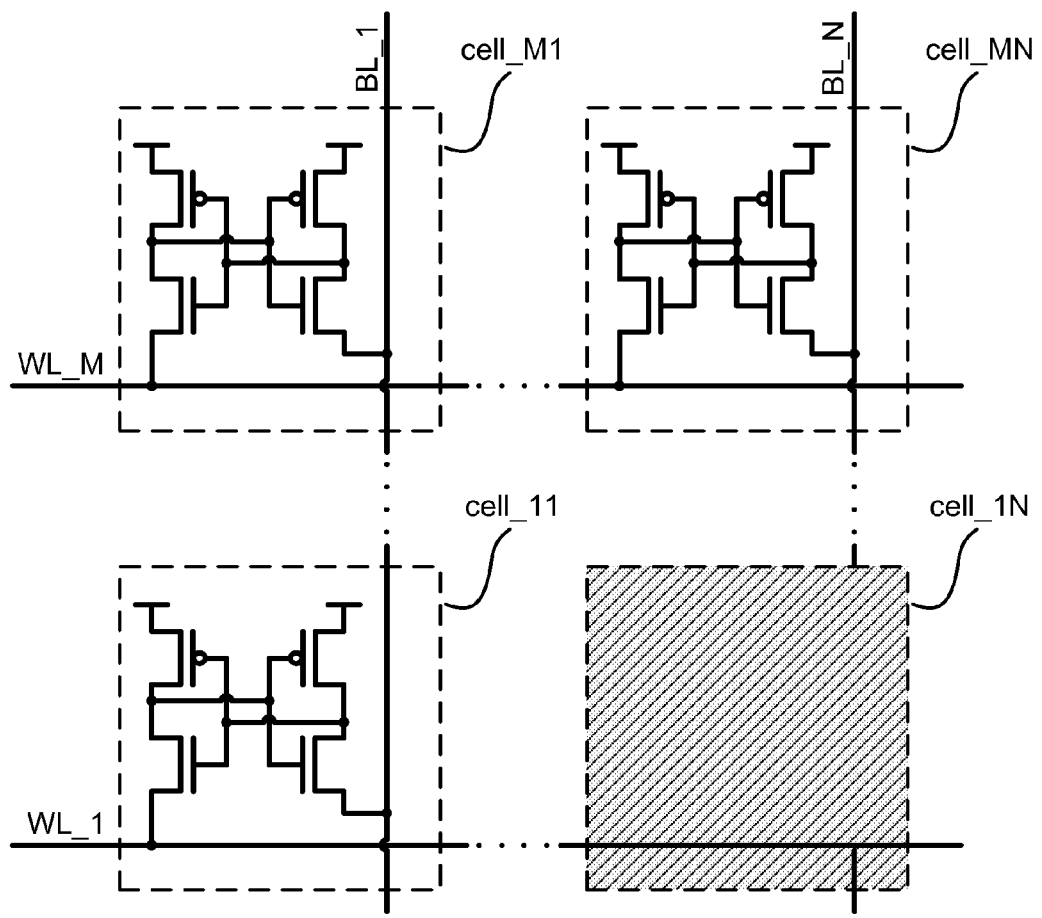
FIG. 3 is a block diagram illustrating an array of 4T SRAM cells.

Referring to FIG. 3, a sample array of SRAM cells 200 is illustrated generally by numeral 300. The array 300 comprises M rows and N columns of SRAM cells 200. A bitline BL is shared among the cells located in a given column. A wordline WL node is shared among all cells in a given row. In addition to the array 300, a memory will also contain blocks such as address decoders, timing and control, sensing and column drivers. These blocks are similar to those found in state-of-the-art SRAM configurations, and therefore are not described in detail. Alternatively, the bitline BL may be shared among the cells located in a given row and the wordline WL node may be shared among all cells in a given column.

Figure 4:
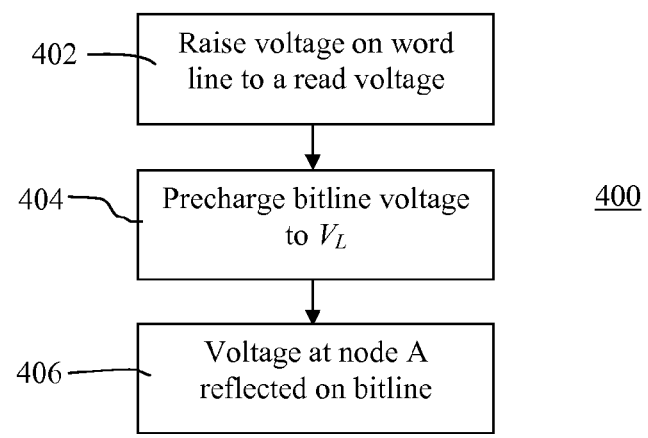
FIG. 4 is a flow chart illustrating a read operation on the 4T SRAM cell.

Referring to FIG. 4, a flow chart illustrating the steps for a read operation is illustrated by numeral 400. At step 402, the wordline WL is raised from the low voltage $V_L$ to read voltage $\Delta V1$. A typical value of the read voltage $\Delta V1$ is chosen to be higher that the threshold voltage $V_T$ of transistor N1. In addition the read voltage $\Delta V1$, together with transistor sizes, is chosen for ensuring a non-destructive read operation. Finally, the read voltage $\Delta V1$ is a compromise between the read current and read data stability. At step 404, the bitline voltage $V_{BL}$ is kept at its nominal value of $V_L$. At step 406, the voltage stored at internal node A is reflected on the bitline BL.

Figure 5:
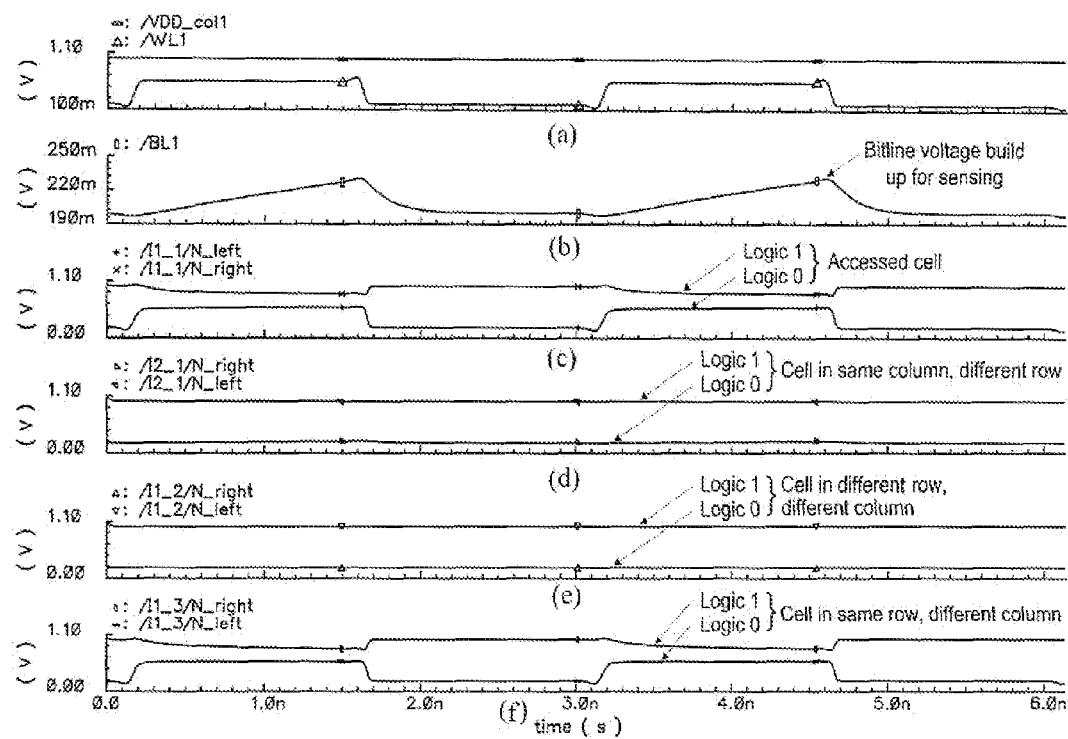
FIG. 5 is a series of simulation waveforms illustrating a read operation when the 4T SRAM stores a logic 1.

An example of a read operation when a logic 1 is stored in the SRAM cell 200 will be described with reference to the timing diagrams illustrated in FIG. 5. When storing a logic 1, the voltage at internal node A is "high" and the voltage at internal node B is "low". As described in step 402 and illustrated in FIG. 5a, the wordline WL is raised from the low voltage $V_L$ to the read voltage ΔV1. At step 404, transistor N1 turns on. At step 406, the voltage stored at node A cause an increase in the voltage on the bitline BL, as illustrated in FIG. 5b. This voltage increase on the bitline BL is interpreted by a sense amplifier (not shown) as a logic 1. Further, referring to FIG. 5c, although the voltage stored at node A drops and the voltage stored at node B increases, once the wordline WL is returned to the low voltage $V_L$, both nodes A and B return to their pre-read operation voltage levels. Thus, the cell is able to retain its data through the read operation.

When the SRAM cell 200 stores a logic 0, the voltage at internal node A is low and the voltage at internal node B is high. Since transistor N2 is off, raising the voltage of the wordline WL to the read voltage ΔV1 will not affect the operation of the SRAM cell 200. Accordingly, with transistor N1 switched on, the bitline voltage $V_{BL}$ remains at approximately $V_L$, which is interpreted by a sense amplifier (not shown) as a logic 0. Further, since the voltages at nodes A and B do not significantly differ during the read operation, the cell is able to retain its data.

FIG. 5d illustrates the effect of a read operation on the storage nodes in cells 200 in the same column as the target cell 200, but in a different row. As expected, since these cells 200 do not share a common wordline WL with the target cell 200, there is no effect on the node voltages throughout the read operation. Similarly, FIG. 5e illustrates the effect of a read operation on the storage node in cells 200 in a different row and different column as the target cell 200.

By contrast, FIG. 5f illustrates the effect of a read operation on the storage nodes in cells 200 in the same row as the target cell, but in a different column. As expected, since these cells 200 share a wordline WL with the target cell 200, the voltage at storage node A drops slightly and the voltage at storage node B increases close to the read voltage ΔV1. However, since the cells are in a different column from the target cell, the corresponding sense amplifier is not activated and the voltage change on the bitline BL is not recorded. Once the read operation is complete, both nodes A and B return to their pre-read operation voltage levels. Thus, the cell is able to retain its data through the read operation.

Figure 6:
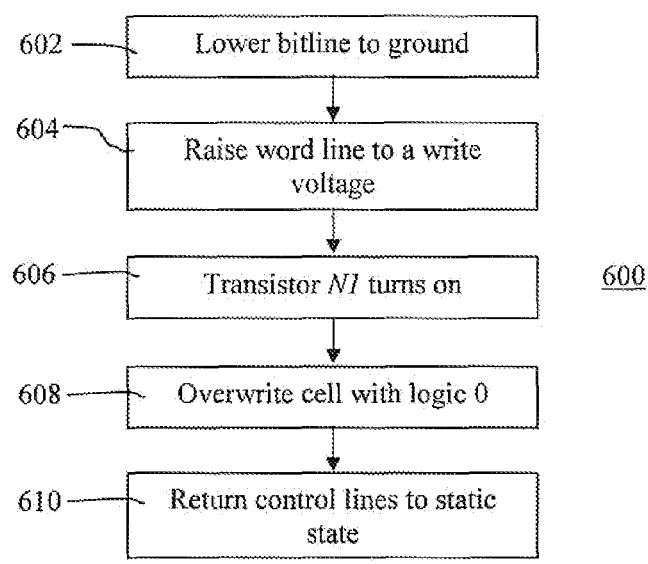
FIG. 6 is a flow chart illustrating a write operation for writing a logic 0 to the 4T SRAM cell.

Referring to FIG. 6, a flow chart illustrating the steps for writing a logic 0 to the SRAM cell 200 is illustrated by numeral 600. It is assumed that node A has high voltage $V_H$ and node B has low voltage $V_L$. At step 602, the bitline voltage $V_{BL}$ is pulled down from the low voltage $V_L$ to the ground potential (0V).

At step 604, the wordline WL voltage is raised from the low voltage $V_L$ to a write voltage ΔV2. Similar to the read operation, the value of the write voltage ΔV2 is chosen such that the gate-to-source voltage $V_{GS}$ of transistor N1 is higher than its threshold voltage $V_T$. Simulation shows that a write voltage ΔV2 of 0.4V is sufficient to write a logic 0 into the cell. A higher value for the write voltage ΔV2, such as the 0.6V used for the read voltage ΔV1, will also facilitate the logic 0 write operation.

At step 606, transistor N1 turns on. Further, the absolute value of gate-to-source voltage $V_{GS}$ of transistor P1 is reduced while the absolute voltage of gate-to-source voltage $V_{GS}$ of transistor P2 is increased. Because of the reduction of the gate-to-source voltage $V_{GS}$ of transistor P1 and increase of the gate-to-source voltage $V_{GS}$ of transistor P2, the static noise margin of the SRAM cell 200 is reduced significantly. Accordingly, at step 608 transistor P1 turns off, node A is pulled down to ground, transistor P2 is turned on and transistor N2 is turned off. Thus, the SRAM cell 200 is overwritten with a logic 0.

At step 610, the wordline WL is reduced to its nominal voltage $V_L$ while the bitline voltage $V_{BL}$ is increased to its nominal value of $V_L$.

Figure 7:
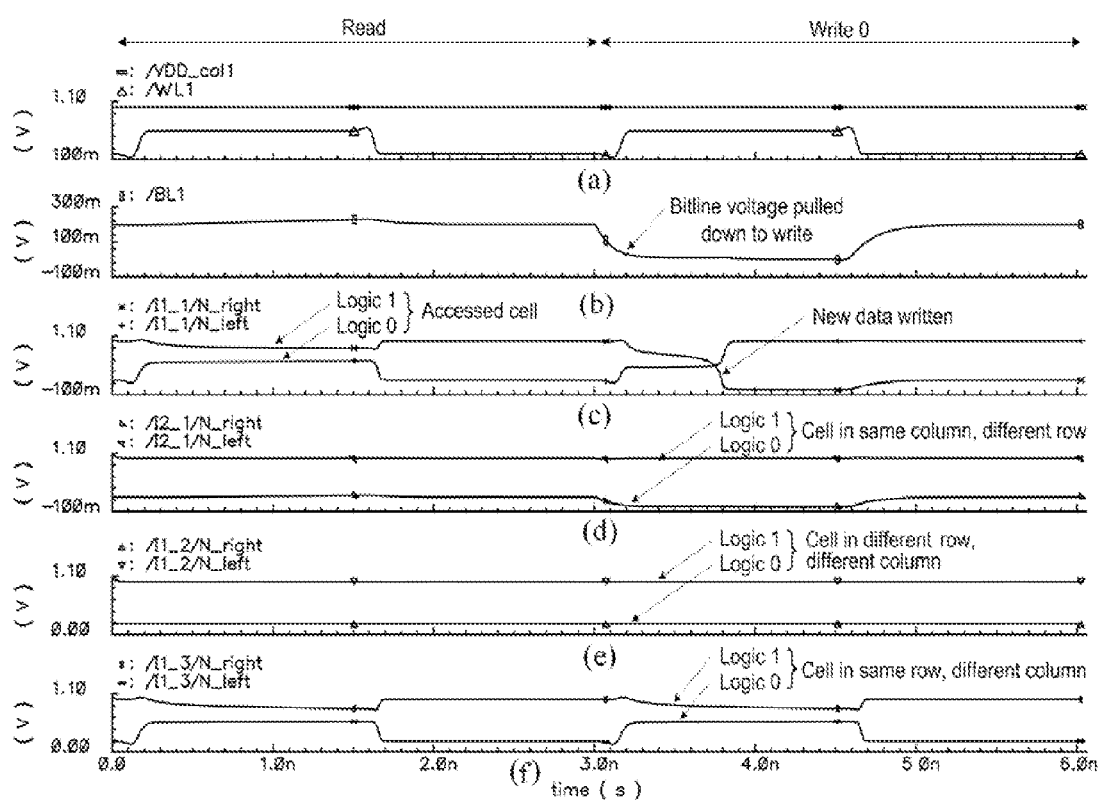
FIG. 7 is a series of simulation waveforms illustrating the write operation of FIG. 6.

An example of writing a logic 0 to the SRAM cell 200 will be described with reference to the timing diagrams illustrated in FIG. 7. As shown in FIG. 7a, the wordline WL voltage is raised to the write voltage ΔV2. As shown in FIG. 7b, the bitline voltage $V_{BL}$ is pulled down to ground potential (0V). As shown in FIG. 7c, the voltages stored at nodes A and B are inversed and the cell has gone from storing a logic 1 to storing a logic 0.

FIG. 7d illustrate the effect of the write operation on the storage nodes in cells 200 in the same column as the target cell 200, but in a different row. As expected, since these cells 200 do not share a common wordline WL with the target cell 200, there is no effect on the node voltages throughout the write operation. Similarly, FIG. 7e illustrates the effect of the write operation on the storage node in cells 200 in a different row and different column as the target cell 200.

By contrast, FIG. 7f illustrates the effect of a write operation on the storage nodes in cells 200 in the same row as the target cell, but in a different column. As expected, since these cells 200 share a common wordline WL with the target cell 200, the voltage at storage node A drops slightly and the voltage at storage node B increases close to the read voltage ΔV1. However, since the cells are in a different column from the target cell 200, the corresponding bitlines BL are not pulled down to ground potential. Once the write operation is complete, both nodes A and B return to their pre-read operation voltage levels. Thus, the cell is able to retain its data through the write operation.

Figure 8:
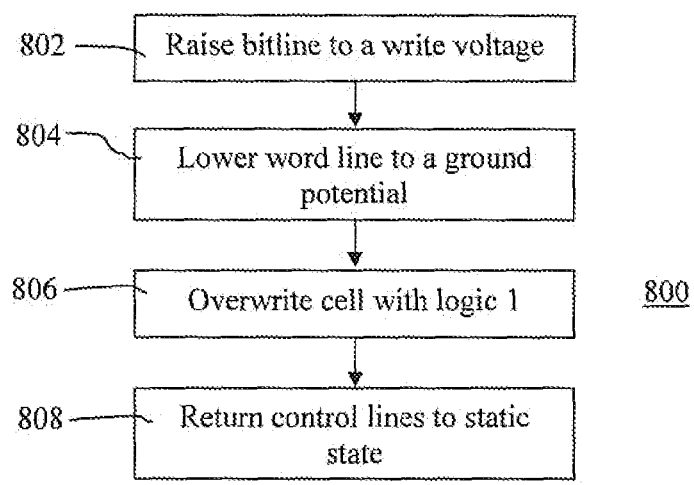
FIG. 8 is a flow chart illustrating a write operation for writing a logic 1 to the 4T SRAM cell.

Similarly, a logic 1 can also be written into the SRAM cell 200. Referring to FIG. 8, a flow chart illustrating the steps for writing a logic 1 to the SRAM cell 200 is illustrated by numeral 800. It is assumed that node A has a low voltage $V_L$ and node B has a high voltage $V_H$. At step 802, the bitline voltage $V_{BL}$ is pulled up from the low voltage $V_L$ to write voltage ΔV3 which is high enough voltage to write logic 1. In the present embodiment, the write voltage is 0.5V, although other voltages may be used, as will be appreciated by a person of ordinary skill in the art.

At step 804, the wordline WL voltage is lowered from the low voltage $V_L$ to the ground potential. This leads to an increase in the gate-to-source voltage $V_{GS}$ of transistor N2 while the gate-to-source voltage $V_{GS}$ of N1 transistor is reduced. In this fashion, the static noise margin of the cell is reduced significantly, and the cell is overwritten with logic 1.

Accordingly, at step 806 transistor N2 turns on, node B is pulled down to ground, transistor N1 is turned off and transistor P1 is turned on, and transistor P2 is turned off. Thus, the SRAM cell 200 is overwritten with a logic 1.

At step 808, the wordline WL is increased to its nominal voltage $V_L$ while the bitline voltage $V_{BL}$ is reduced to its nominal value of $V_L$.

Figure 9:
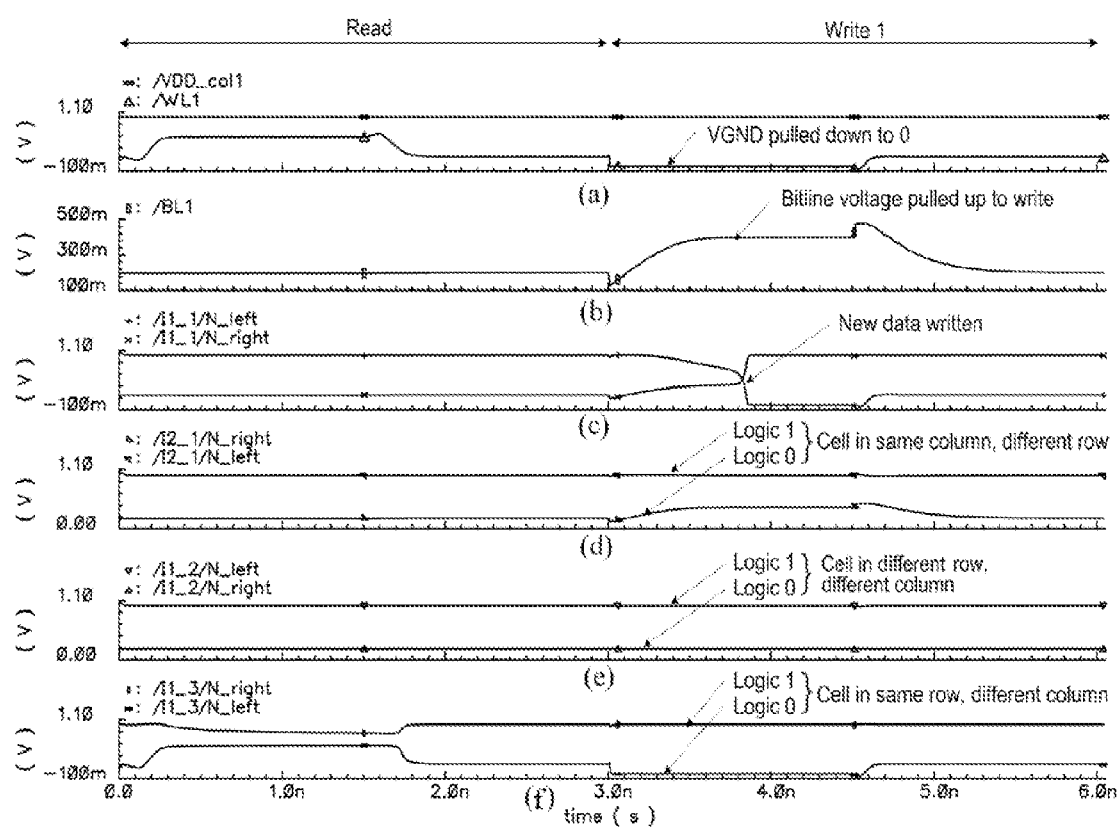
FIG. 9 is a series of simulation waveforms illustrating the write operation of FIG. 8.

An example of writing a logic 1 to the SRAM cell 200 will be described with reference to the timing diagrams illustrated in FIG. 9. As shown in FIG. 9a, the wordline WL voltage is pulled down to ground potential. As shown in FIG. 9b, the bitline voltage $V_{BL}$ is increased to a write voltage ΔV3 or 0.5V. As shown in FIG. 9c, the voltages stored at nodes A and B are inversed and the cell has gone from storing a logic 0 to storing a logic 1.

FIG. 9d illustrate the effect of the write operation on the storage nodes in cells 200 in the same column as the target cell 200, but in a different row. As expected, since these cells 200 do not share a common wordline WL with the target cell 200, there is no effect on the node voltages throughout the write operation. Similarly, FIG. 6e illustrates the effect of the write operation on the storage node in cells 200 in a different row and different column as the target cell 200.

By contrast, FIG. 9f illustrates the effect of a read operation on the storage nodes in cells 200 in the same row as the target cell, but in a different column. As expected, since these cells 200 share a common wordline WL with the target cell 200, the voltage at storage node B drops slightly. However, since the cells are in a different column from the target cell 200, the corresponding bitlines BL are not pulled up to the write voltage ΔV3. Accordingly, once the write operation is complete, both nodes A and B return to their pre-read operation voltage levels. Thus, the cell is able to retain its data through the write operation.

Figure 10:
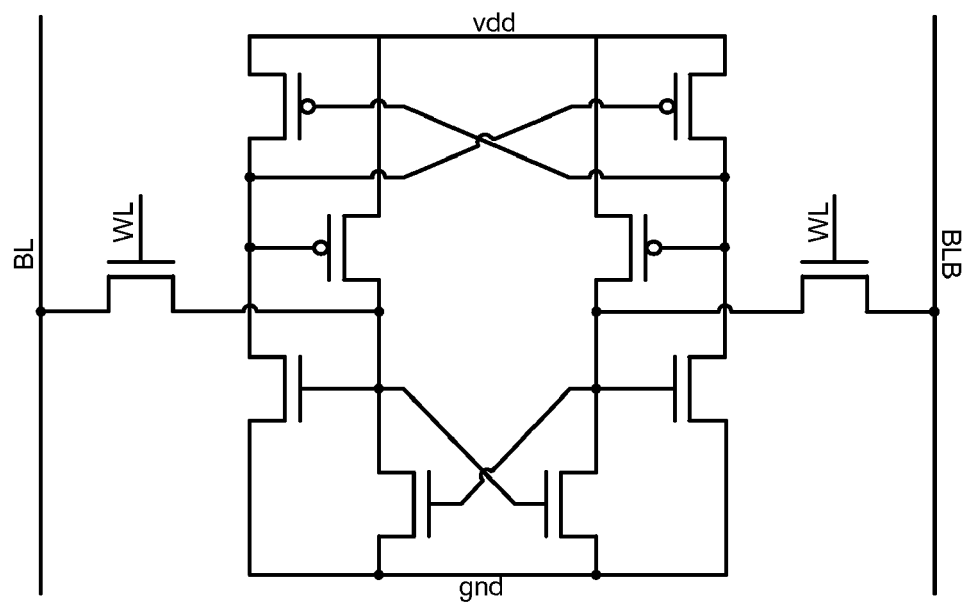
FIG. 10 is a schematic diagram of a prior art 10T SRAM cell.
Figure 11:
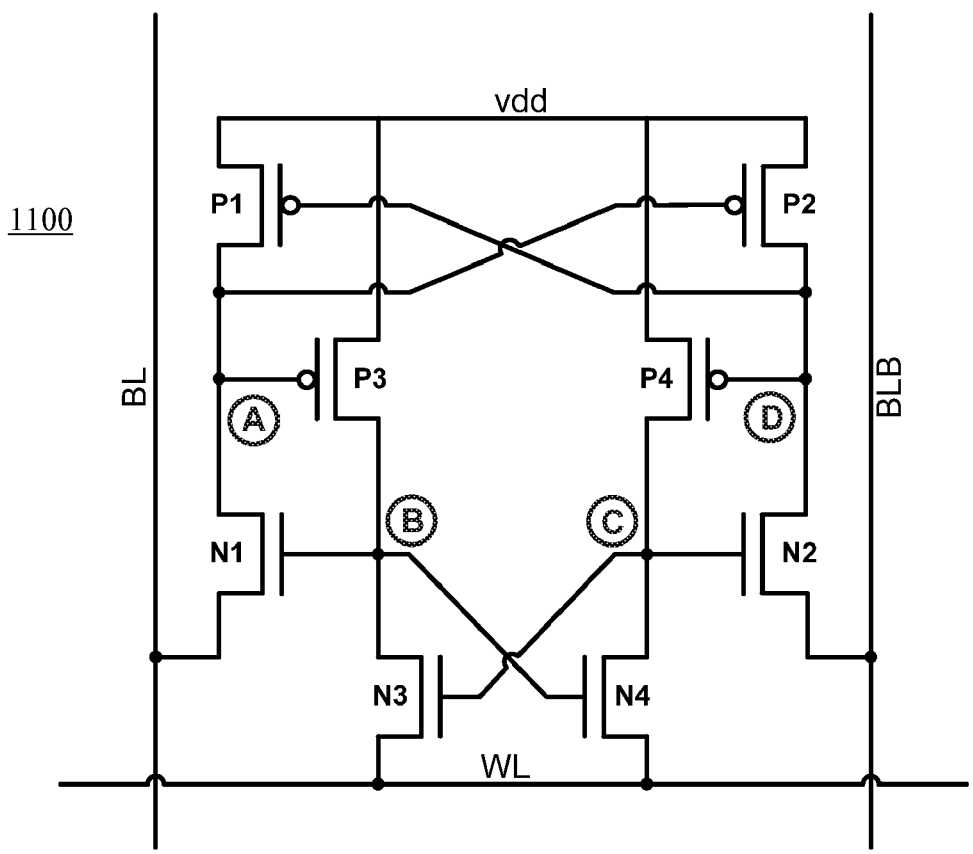
FIG. 11 is a schematic diagram of an 8T SRAM cell in accordance with an embodiment of the present invention.

Referring to FIG. 11, an eight-transistor (8T) SER SRAM cell in accordance with an embodiment of the invention is illustrated generally by numeral 1100. The configuration of the 8T SER CELL 1100 is similar to the 10T SER cell shown in FIG. 10, with the exception that it does not require the use of dedicated access transistors. Accordingly, the proposed 8T SER SRAM cell 1100 provides the stability and SER robustness of the 10T SRAM cell but uses fewer transistors.

The 8T SER SRAM cell 1100 comprises four NMOS transistors N1, N2, N3, N4 and four PMOS transistors P1, P2, P3, P4. As is standard in the art, the 8T SER SRAM cell 1100 is connected in a quad-latch configuration. The configuration also provides four storage nodes A, B, C, D, which interlock. The storage nodes A, B, C, D are used to store two complementary states. Nodes A and C store one logical value and nodes B and D store the complementary logical value.

Transistors P1, P2, P3, P4 are supply transistors and are coupled at their source to a power supply VDD. Transistors N1 and N2 are line transistors and coupled at their respective sources to one of a differential bitline pair BL and BLB. Transistors N3 and N4 are line transistors and are both coupled at their source to a wordline WL. The 8T SRAM cell 1100 is accessed differentially using two transistors N1 and N2. The source of the two cross-coupled NMOS transistors N3 and N4 is controlled in order to turn on transistors N1 and N2 and enable read and write operations.

Accordingly, as will be explained below, the 8T SER SRAM cell 1100 is able retain logic data in a similar fashion to the 10 SER SRAM cell so long as it is powered.

Figure 12:
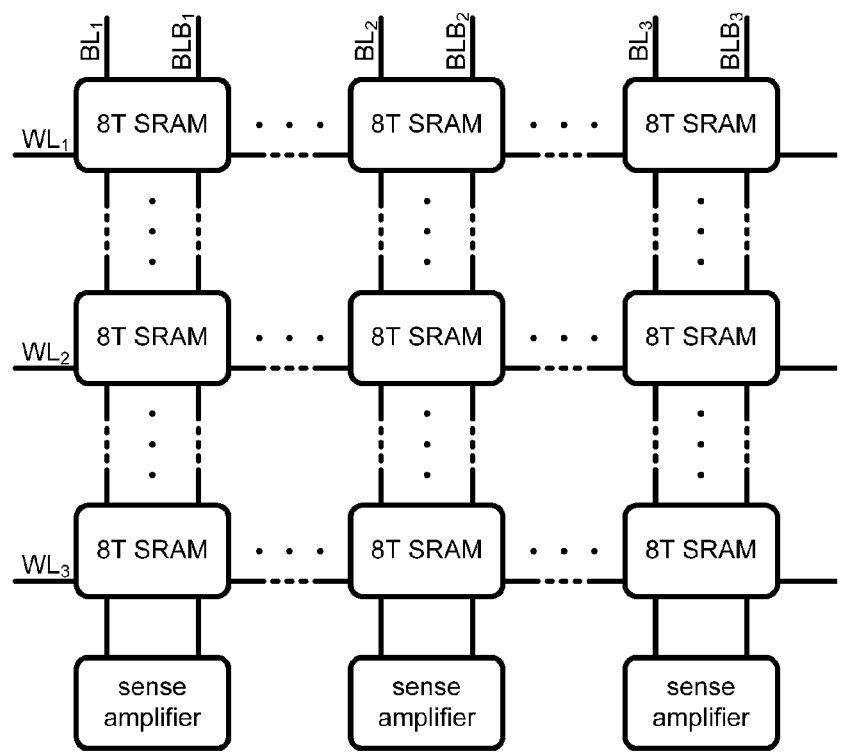
FIG. 12 is a block diagram illustrating an array of 8T SRAM cells.

Referring to FIG. 12, a sample array of SRAM cells 1100 is illustrated generally by numeral 1200. The array 1200 comprises M rows and N columns of SRAM cells 1100. A bitline pair BL and BLB is shared among the cells located in a given column. A wordline WL is shared among all cells in a given row. In addition to the array 1200, a memory will also contain blocks such as address decoders, timing and control, sensing and column drivers. These blocks are similar to those found in state-of-the-art SRAM configurations, and therefore are not described in detail. Alternatively, the bitline pair BL and BLB may be shared among the cells located in a given row and the wordline WL may be shared among all cells in a given column.

Figure 13:
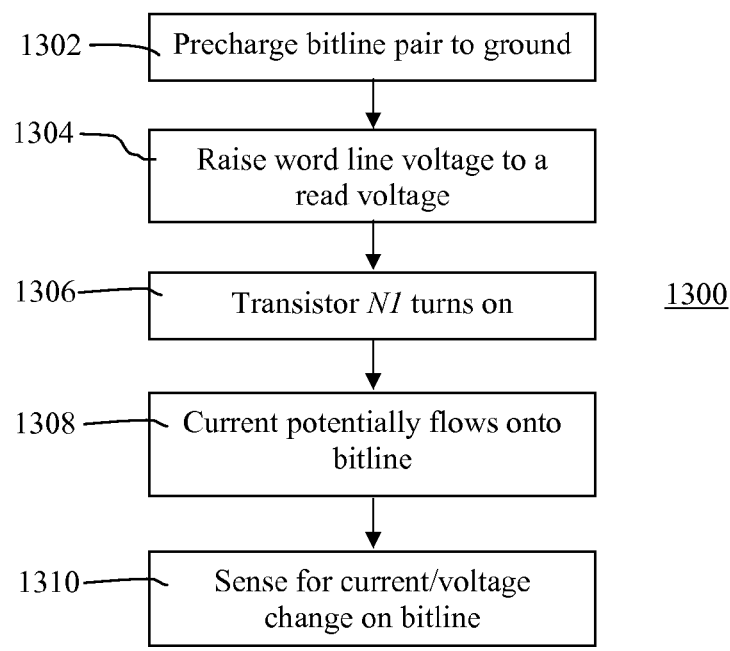
FIG. 13 is a flow chart illustrating a read operation for the 8T SRAM cell of FIG. 11.

Referring to FIG. 13 the read operation on the 8T SRAM cell 1100 is illustrated generally by numeral 1300. In the present embodiment, it is assumed that the supply voltage VDD is 1V, the initial voltage at nodes A and C is 1V value and the initial voltage at nodes B and D is 0V. Thus, the cell 1100 stores a logic 1.

At step 1302, the differential bitline pair BL and BLB are pre-charged to 0V and the allowed to float.

At step 1304, the wordline WL voltage is raised to a read voltage ΔV4 value which is greater than the threshold voltage of transistors N1 and N2. In this embodiment, the read voltage ΔV4 is 0.4V. As the wordline WL voltage is raised, the voltage at node B is also raised to 0.4V. The read voltage ΔV4, together with transistor sizes, are chosen for ensuring a non-destructive read operation. Finally, in the present embodiment, the read voltage ΔV4 is a compromise between the read current and read data stability.

At step 1306, the increased voltage at node B causes transistor N1 to be weakly turned on. At step 1308, current flows from the supply, through transistors P1 and N1 and onto the bitline BL. At step 1310, the current flowing into the bitline BL, or the resulting voltage increase, is sensed by a sense amplifier (not shown).

Since the cell is differential, the read operation will be similar when the stored value is reversed and the initial voltage at nodes A and C is 0V value and the initial voltage at nodes B and D is 1V. However, in such an embodiment node C would be raised to 0.4V, which would result in transistor N2 being weakly turned on. This, in turn, would result in a current flowing onto the bitline BLB.

That it will be appreciated the logic state of a cell can be read by determining which of the bitline pair BL or BLB is determined to have an increased current activity.

Figure 14:
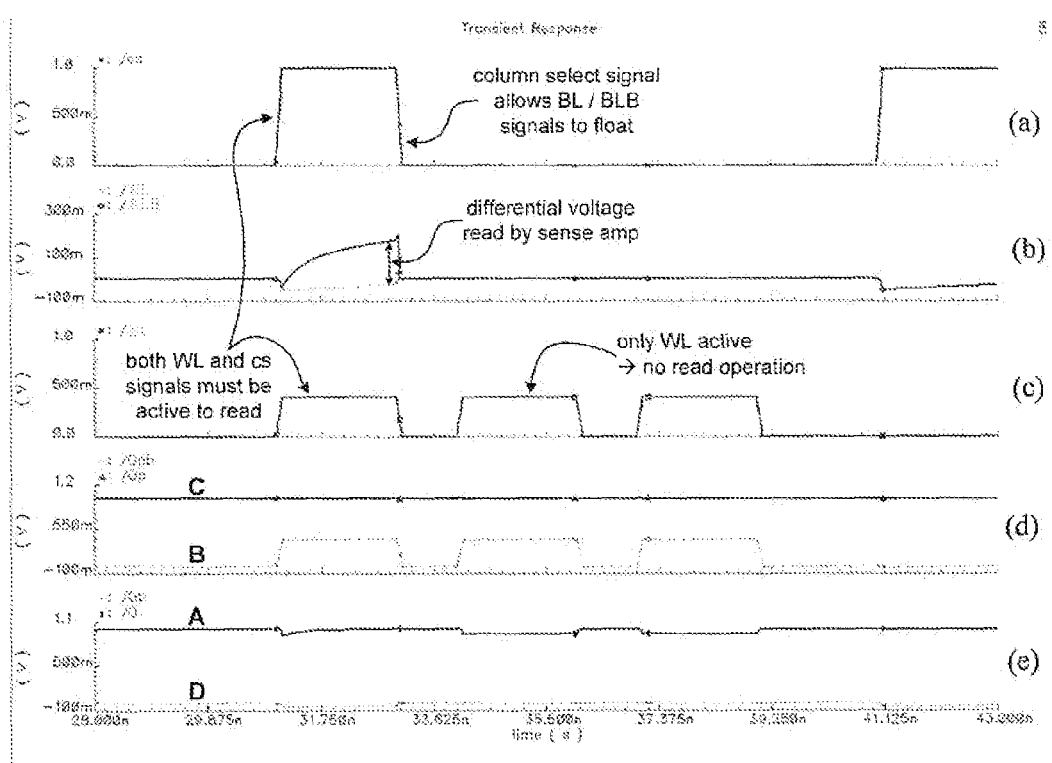
FIG. 14 is a series of simulation waveforms illustrating the read operation of FIG. 13.

An example of a read operation when a logic 1 is stored in the 8T SRAM cell 1100 will be described with reference to the timing diagrams illustrated in FIG. 14. As illustrated in FIG. 14a, a column select signal activates a corresponding bitline pair BL and BLB by pulling them to ground and allowing the signals to float. As illustrated in FIG. 14c, the wordline WL is increased to the read voltage ΔV4. Accordingly, as illustrated in FIG. 14d, the voltage at node B also increases to the read voltage ΔV4, which turns on transistor N1. FIG. 14b illustrates the differential voltage across the bitline pair BL and BLB detected by the sense amplifier.

Figure 15:
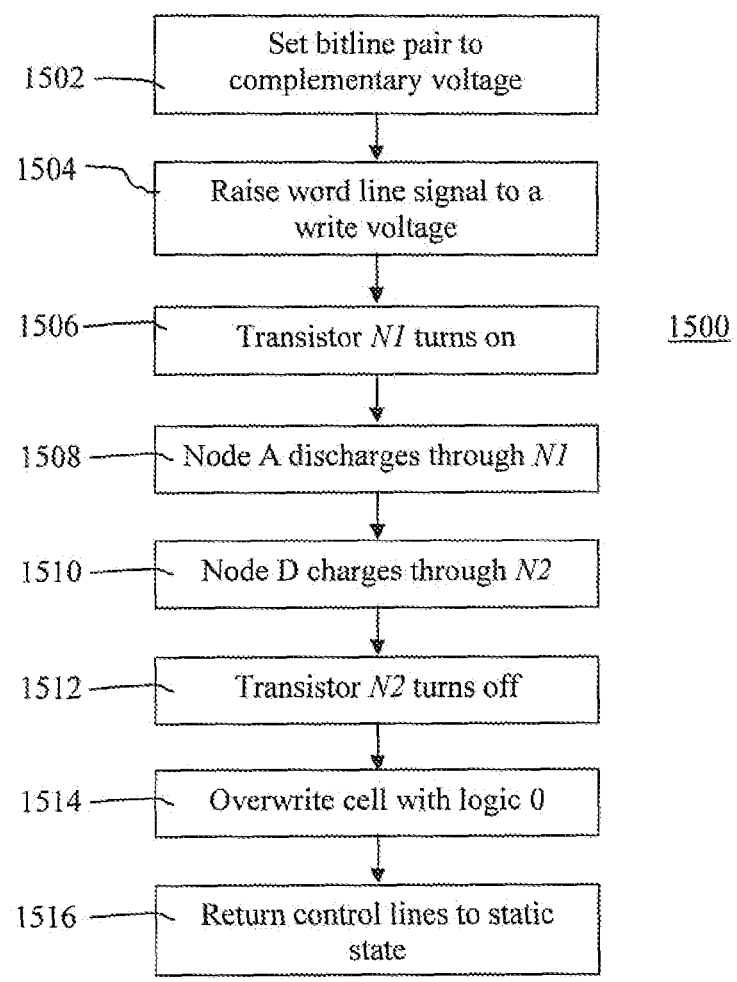
FIG. 15 is a flow chart illustrating a write operation for writing a logic 0 to the 8T SRAM cell.

Referring to FIG. 15, a flow chart illustrating the steps for writing a logic 0 to the 8T SRAM cell 1100 is illustrated by numeral 1500. In this example, a logic 1 is stored in the 8T SRAM cell 1100 so the initial voltage at nodes A and C is 1V and that the initial voltage at nodes B and D is 0V.

At step 1502 the bitline pair is set so that bitline BL is set to 0V and bitline BLB is set to 1V. At step 1504, the voltage on the wordline WL is increased to a write voltage ΔV5. The write voltage ΔV5 is greater than the threshold voltage of the NMOS transistors N1, N2, N3, N4, which is 0.4V in this example. As the WL voltage increases, the voltage at node B also increases 0.4V.

At step 1506, the increased voltage at node B causes transistor N1 to be weakly turned on. At step 1508, since the bitline BL signal is 0V, node A will discharge through transistor N1. Node C is not affected by the increase in the wordline WL voltage, staying at 1V and keeping transistor N2 fully on. Since the bitline BLB is at 1V and transistor N2 is on, at step 1510 the voltage at node D begins charging up from 0V.

At step 1512, the voltage at node D has increased to the point where the gate-to-source voltage Vgs of transistor N2 is less than its threshold voltage Vt, in this example approximately 0.6V, and transistor N2 turns off. By this time nodes A and D have been sufficiently changed to low and high voltages respectively, that the internal feedback of the 8T SRAM cell 1100 takes over and, at step 1514 completes the process by changing nodes B and C to high and low voltages, respectively.

At step 1516, the bitline pair BL and BLB are returned to their nominal voltages and the write to the 8T SRAM cell 1100 is complete.

Since the cell is differential, writing a logic 1 to an 8T SRAM cell 1100 storing a logic 0 operates in a similar fashion to that described with reference to FIG. 15. However, in this example, the initial voltage at nodes A and C is 0V and that the initial voltage at nodes B and D is 1V. Accordingly, in order to write a logic 1 the bitline pair is set so that bitline BL is set to 1V and bitline BLB is set to 0V. Thus, when the voltage of the wordline WL is increased to the write voltage $\Delta V5$, the bitline BL charges node A and the bitline BLB discharges node D, partially flipping the cell. The internal feedback takes over and completes the flip and hence the logic 1 is written.

Accordingly, the 8T SRAM cell 1100 reduces the number of transistors required for a traditional SER cell. Further, the 8T SRAM 1100 is also robust to soft-errors. In the present example, the 8T SRAM cell stores a logic 0, 1, 0, 1 at nodes A, B, C, D, respectively. Accordingly, transistors N1, P3, N4, and P2 are on and transistors N2, P1, N3 and P4 are off. If a particle strike were to strike node A and cause the state of node A to flip to a logical 1 state, transistors P2 and P3 would turn off. However, this does not result in any other node changing state. Node B is still at logical state 1 and hence transistor N1 is still on. This means that in time node A will discharge and the cell will return to its original state.

Figure 16:
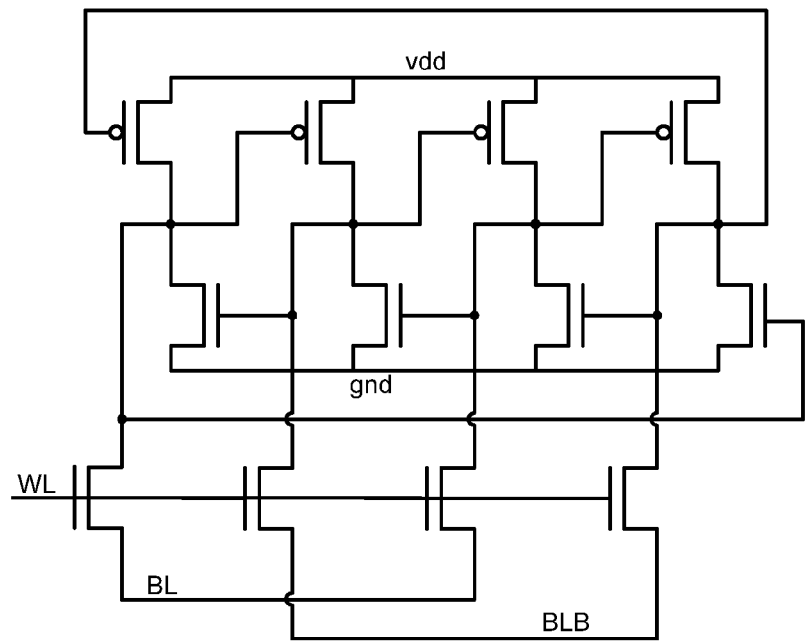
FIG. 16 is a schematic diagram of a prior art DICE SRAM cell.

The concepts described above with reference to the 4T SRAM Cell 200 and the 8T SER SRAM cell 1100 can further be applied to a state-of-the-art dual-interlocking storage cell (DICE cell), illustrated in FIG. 16. As is know in the prior art, the DICE cell has a further improved robustness to soft errors. Data is stored on multiple nodes and the DICE cell is immune to single node upsets. However, the DICE cell requires twice as many transistors to implement as the standard 6T SRAM circuit, making it expensive in terms of both area and power.

Figure 17:
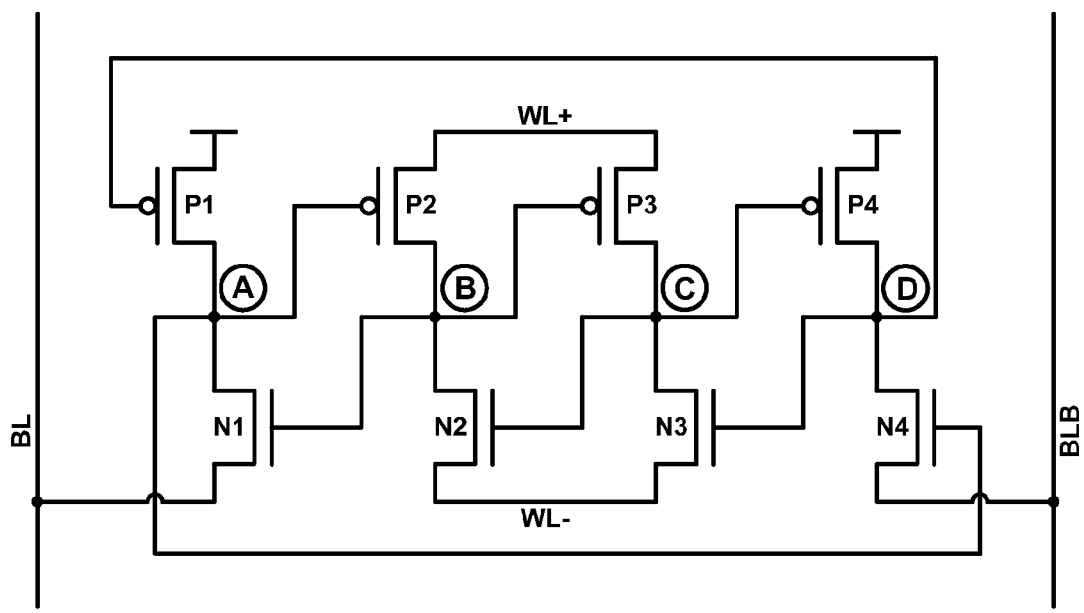
FIG. 17 is a schematic diagram of an 8T DICE SRAM cell in accordance with an embodiment of the present invention.

Accordingly, as illustrated in FIG. 17, an 8T DICE SRAM cell in accordance with the present embodiment is illustrated generally by numeral 1700. The core of the 8T DICE SRAM cell is similar to the state-of-the-art DICE SRAM cell. Specifically, the 8T DICE SRAM cell comprises four NMOS transistors N1, N2, N3 and N4 and four PMOS transistors P1, P2, P3 and P4, which are connected such that they form four internal nodes A, B, C, D. The internal nodes A, B, C, D are used to store two complementary states. Nodes A and C store the same logical value and nodes B and D store the same logic value. The logic value stored at nodes A and C are complementary to the logic value stored at nodes B and D.

Figure 18A:
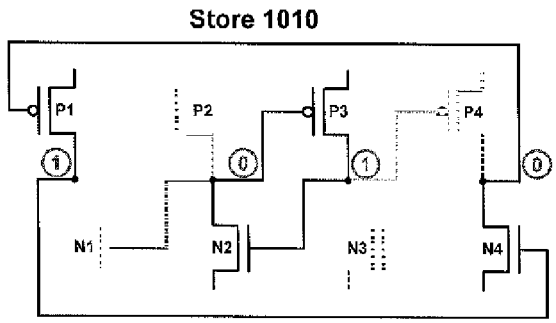
FIGS. 18a and b are schematic diagrams illustrating the condition of the 8T DICE SRAM cell in static condition.
Figure 18B:
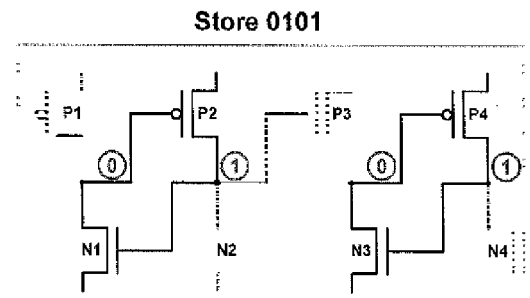

In the static condition the DICE cell can be view as two independent half latches, as shown in FIGS. 18a and 18b. As shown in FIG. 18a, if the cell stores a logic 1, 0, 1, 0 at nodes A, B, C, D, then transistors N4 and P1 form one half-latch and transistors N2 and P3 form another half-latch. Transistors N1, P2, N3, and P4 are turned off. As shown in FIG. 18b, if the cell stores a logic 0, 1, 0, 1 at nodes A, B, C, D, then transistors N1 and P2 form one half-latch and transistors N3 and P4 form another half-latch. Transistors N2, P1, N4, and P3 are turned off. In both examples, the latches store the data independently, and it is difficult, if not impossible, to write into both nodes of either half-latch by corrupting only one node. Moreover, the half-latches are regenerative, such that if any single node is corrupted the cell will recover the original data in time.

However, the 8T DICE SRAM cell 1700 differs from the prior art implementation in that it also comprises bitline pair BL and BLB and wordline pair WL+ and WL− coupled directly to the 8T DICE SRAM, thereby eliminating the need for dedicated access transistors.

Rather, transistors P1 and P4 are supply transistors and are coupled at their source to the power supply VDD. Transistors P2 and P3 are line transistors and are coupled at their source to the wordline WL+. Transistors N1 and N4 are line transistors and each is coupled at its source to a corresponding one of the bitline pair BL and BLB, respectively. Transistors N2 and N3 are line transistors and are coupled at their source to the wordline WL−.

Figure 19:
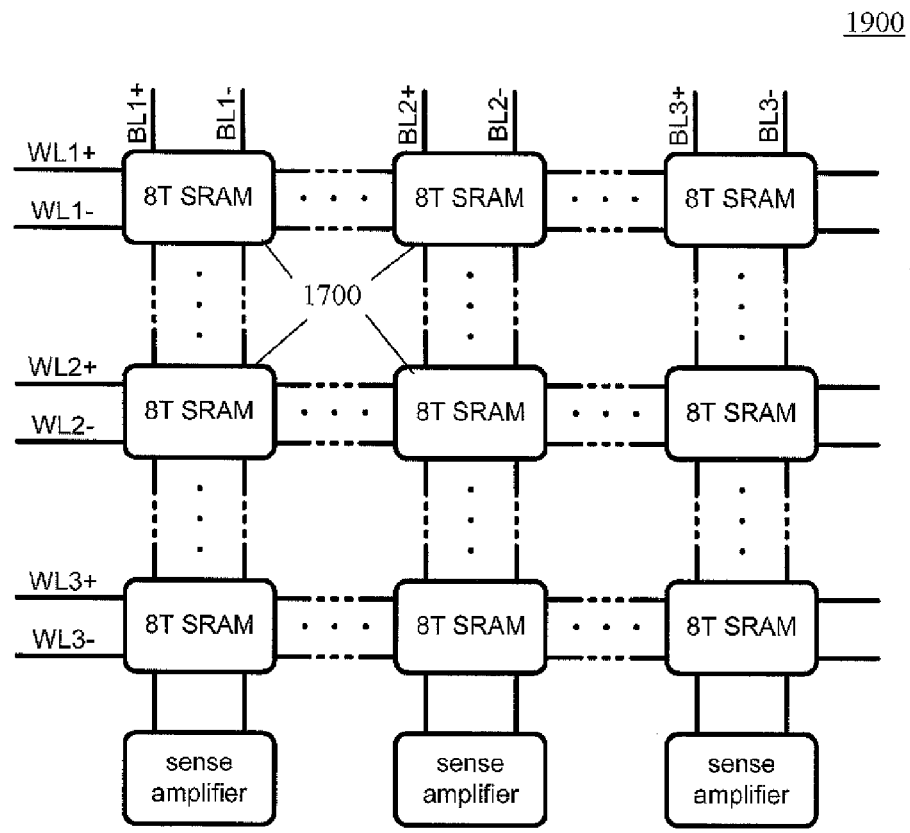
FIG. 19 is a block diagram illustrating an array of 8T DICE SRAM cells.

Referring to FIG. 19, a sample array of 8T DICE SRAM cells 1700 is illustrated generally by numeral 1900. The array 1900 comprises M rows and N columns of 8T DICE SRAM cells 1700. A bitline pair BL and BLB is shared among the cells located in a given column. A wordline pair WL+ and WL− is shared among all cells in a given row. In addition to the array 1900, a memory will also contain blocks such as address decoders, timing and control, sensing and column drivers. These blocks are similar to those found in state-of-the-art SRAM cells, and therefore are not described in detail. Alternatively, the bitline pair BL and BLB may be shared among the cells located in a given row and the wordline pair WL+ and WL− may be shared among all cells in a given column. The row and column signal can be switched for all arrays described herein. In another embodiment, bitline pair BL and BLB, and wordline WL+ may be shared among cells in a column while wordline WL− is shared among the cells in a row.

Figure 20:
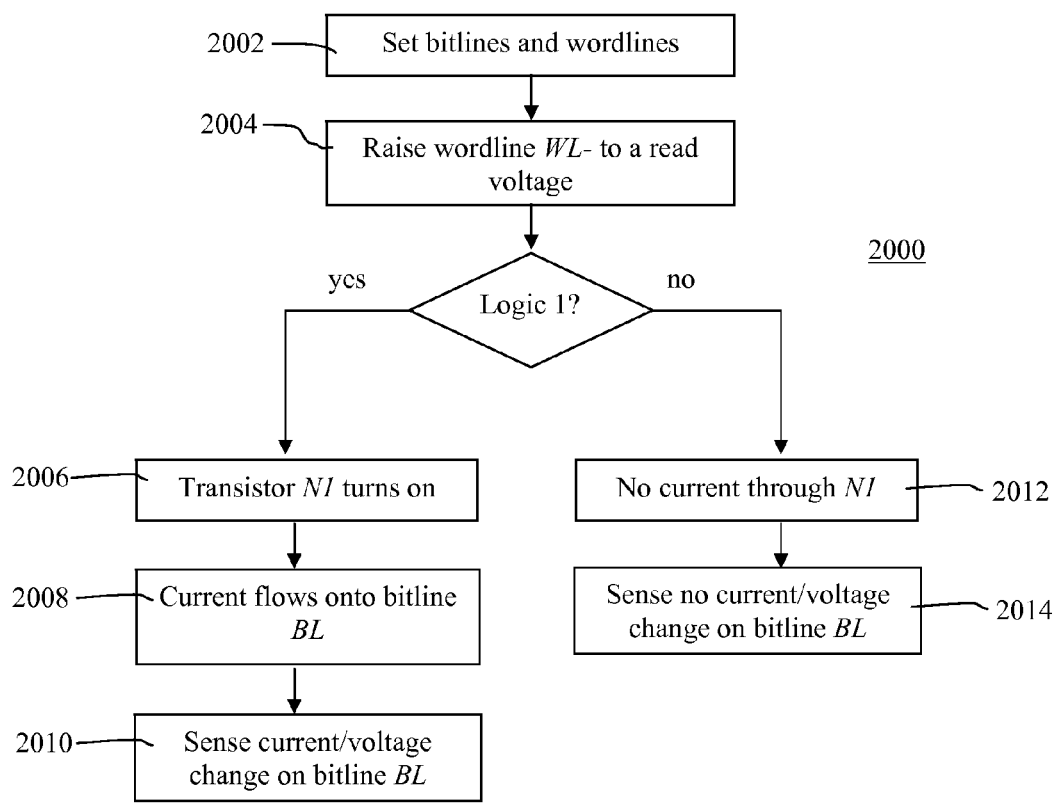
FIG. 20 is a flow chart illustrating a read operation for the 8T DICE SRAM cell of FIG. 17.

Referring to FIG. 20, a flow chart illustrating a read operation for the 8T DICE SRAM cell 1700 is illustrated generally by numeral 2000. At step 2002, the bitline BL is pre-charged to ground potential (0V), the bitline BLB is coupled to ground potential (0V) and the wordline WL+ is connected to the supply voltage VDD.

At step 2004, the read operation is enabled by raising the voltage on the wordline WL− to a read voltage $\Delta V6$. The read voltage $\Delta V6$ is greater than the threshold voltage of the NMOS transistors. In this example $\Delta V6$ is set to 0.5V, however it would be possible to have a different implementation with a different voltage $\Delta V6$. If the state of node A is a logic 1, then at step 2006 the increased voltage on node B causes transistor N1 to be weakly turned on. At step 2008 current flows from the supply voltage VDD, through transistors P1 and N1 and onto the bitline BL. At step 2010, this current, or the resulting voltage increase on BL, can be sensed by a sense amplifier (not shown) and determined to be logic 1.

If the state of node A is '0' then at step 2012 no current flows through transistor N1 and the voltage on BL remains constant. In this case, at step 2014, the output of the sense amplifier can be determined to be logic 0.

Figure 21:
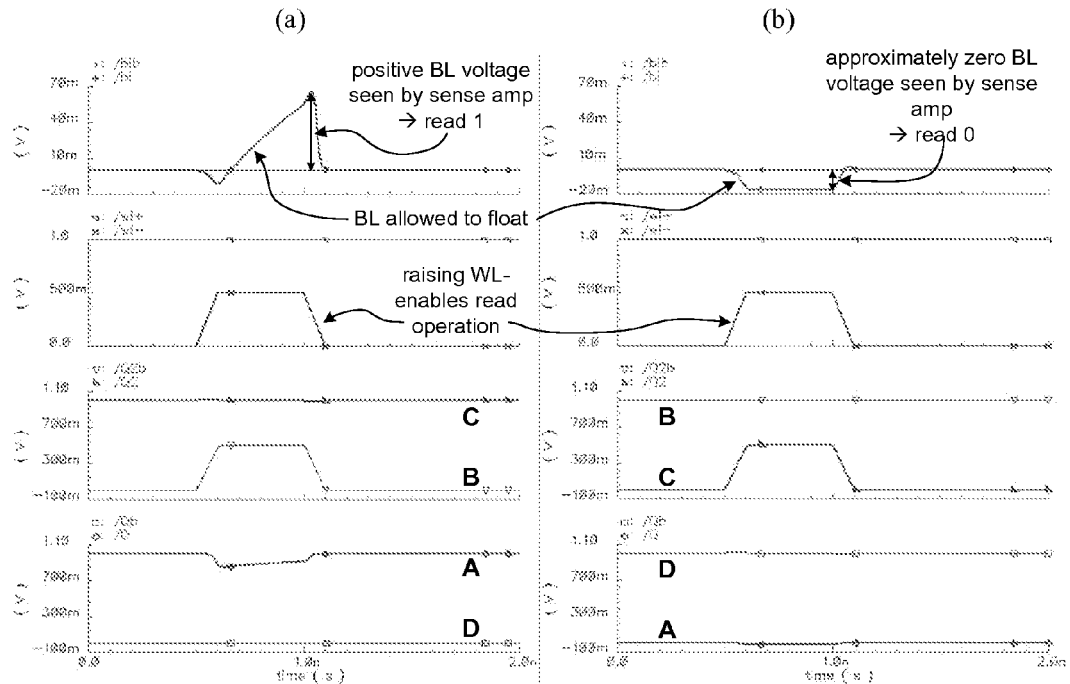
FIG. 21 is a series of simulation waveforms illustrating the read operation of FIG. 20.

Referring to FIGS. 21a and 21b, a series of timing diagrams illustrates the read operation for sensing logic 1 and a logic 0, respectively. As illustrated, raising the bitline WL− enables the read operation. As illustrated in FIG. 21a, the increase in voltage on bitline BL indicates logic 1. As illustrated in FIG. 21b, there is no increase in the voltage on bitline BL, which indicates a logic 0.

Figure 22:
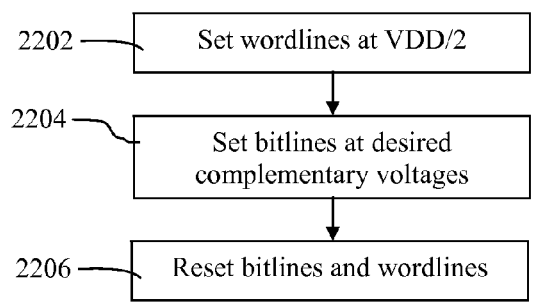
FIG. 22 is a flow chart illustrating a write operation for the 8T DICE SRAM cell.

Referring to FIG. 22, a flow chart illustrating a write operation for the 8T DICE SRAM cell 1700 is illustrated generally by numeral 2200. At step 2202, the wordline pair WL+ and WL− are connected to a common voltage. In this example the common voltage is VDD/2 however in other implementations a different common voltage could be applied to WL+ and WL−. This sufficiently weakens the cell 1700 to enable a write operation by limiting the ability of nodes B and C to affect the state of nodes A and D.

At step 2204, the appropriate different data is driven on the bitline pair BL and BLB. That is, in the present embodiment, the supply voltage VDD is applied to bitline BL and ground potential is applied to BLB for a logic 1, and vice versa for a logic 0. These voltages are able to change the state of nodes A and D. Once the states of nodes A and D are changed, the write event propagates to nodes B and C.

Figure 23:
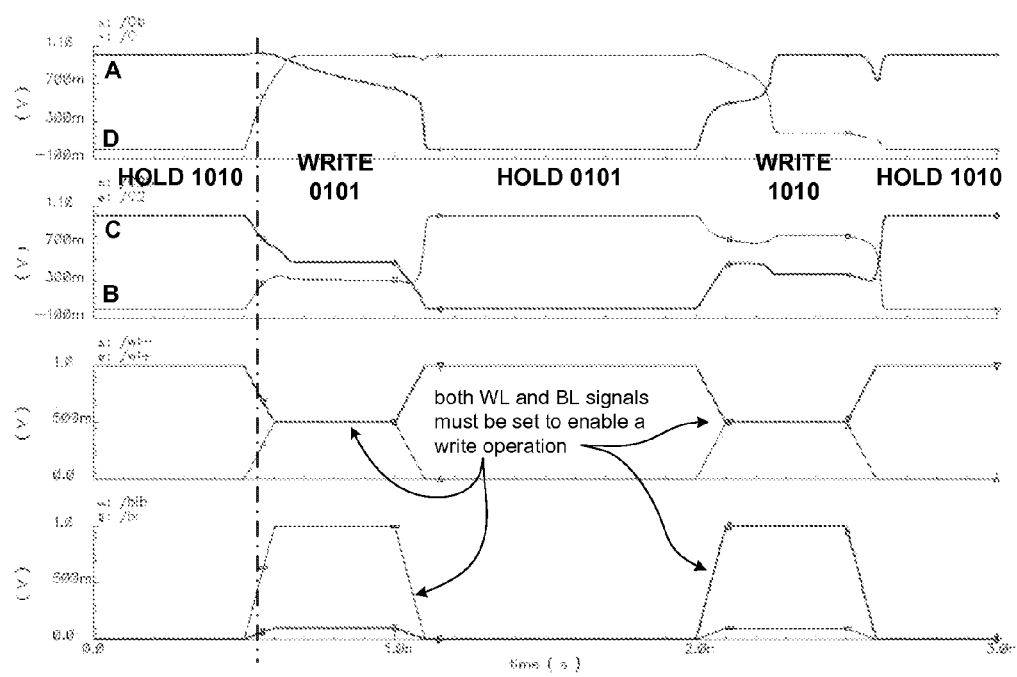
FIG. 23 is a series of simulation waveforms illustrating the write operation of FIG. 22.

Finally, at Step 2206, the bitlines BL and BLB are returned to the ground potential, wordline WL− is also connected to ground, and wordline WL+ is re-connected to the supply voltage VDD. Once the write operation is complete the 8T DICE SRAM cell 1700 holds the new data and returns to the static condition. In addition to the flow chart, the write operation is shown by a series of simulation waveforms illustrated in FIG. 23.

Figure 24:
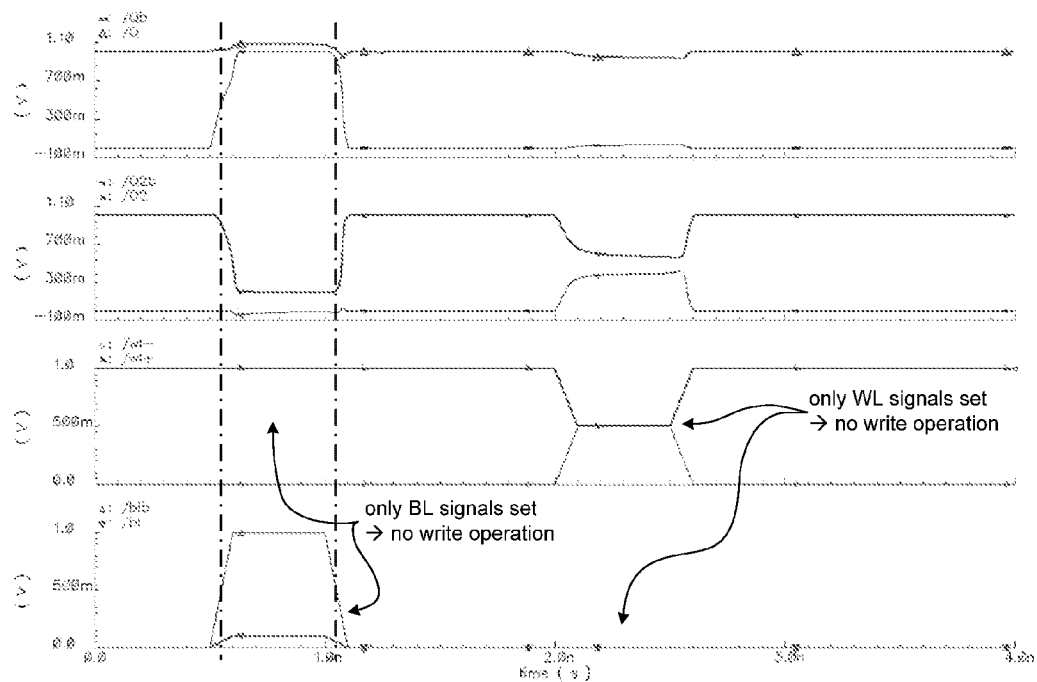
FIG. 24 is a series of simulation waveforms illustrating the write operation of FIG. 22 on a half-selected cell.

Accordingly, in the present embodiment, in order to write to the 8T DICE SRAM cell 1700, both the bitline pair BL and BLB and the wordline pair WL+ and WL− are enabled. If only one of the bitline pair or the wordline pair is enabled it is referred to as a half-selected cell. The affect of the write operation on a half-selected cell is shown by a series of simulation waveforms illustrated in FIG. 24. As illustrated, data is not written into a cell which is half-selected.

Accordingly, it will be appreciated that the 8T DICE SRAM cell 1700 reduces the number of transistors required to implement a cell. Further, the 8T SRAM DICE cell 1700 is robust to soft errors. For example, consider a particle strike on node A. In this example, the initial logical state at nodes A and C is 0 and that the initial logical state at nodes B and D is 1. Initially transistors N1, P2, N3, and P4 are on, and transistors N2, P1, N4 and P3 are off. The charge collected by the particle strike causes the state of node A to flip, such that it is now at a logical 1 state. This has the effect of turning off transistors P2 and turning on transistor N4. Turning on transistor N4 will cause node D to change state from 1 to 0. At this point the error can propagate no further. N1 eventually overpowers P1, returning node A to zero. This in turn turns off N4, node D returns to '1', and the cell has recovered.

If the error occurs on node B the situation is similar. Node B flips from state 1 to state 0. This causes P3 to turn on and N1 to turn off. If P3 can overpower N3 then node C will change state to 1. At this point, the error can propagate no further and the cell returns to the original state.

Figure 25:
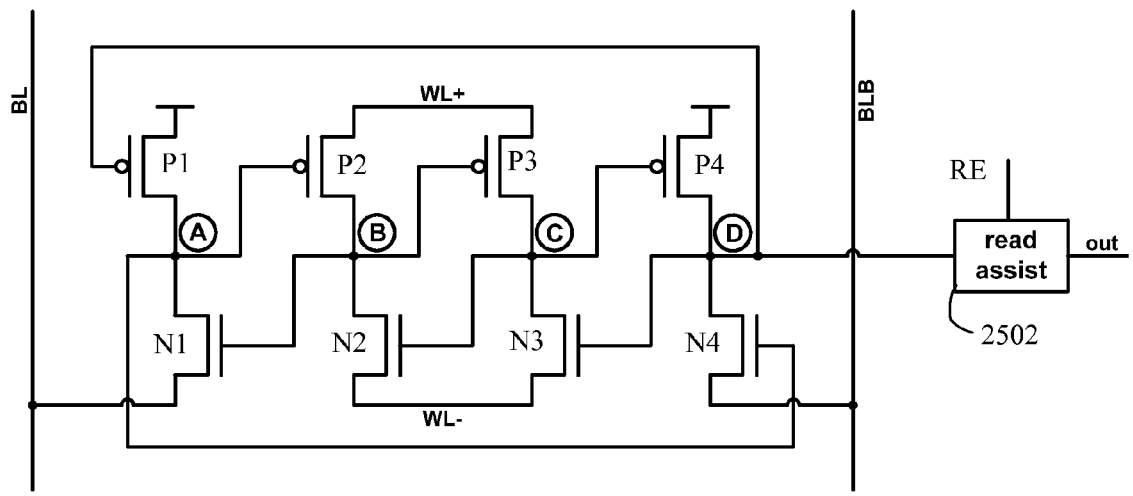
FIG. 25 is a schematic diagram of a 10T DICE SRAM cell in accordance with an embodiment of the present invention.

Referring to FIG. 25, an alternate embodiment of the 8T DICE SRAM cell 1700 is illustrated. In the present embodiment, a 10T DICE SRAM cell 2500 is provided. The 10T DICE SRAM cell 2500 is similar to the 8T DICE SRAM cell 1700, with the addition of a read assist circuit 2502. The read assist circuit 2502 comprises a pair of transistors and is configured to improve the read time of the 8T DICE SRAM cell 1700. Accordingly, it will be appreciated that the improved speed comes at the cost of additional transistors. It will also be appreciated that the use of a read assist circuit to improve the speed of the read operation can be applied to other embodiments, as desired.

Figure 26:
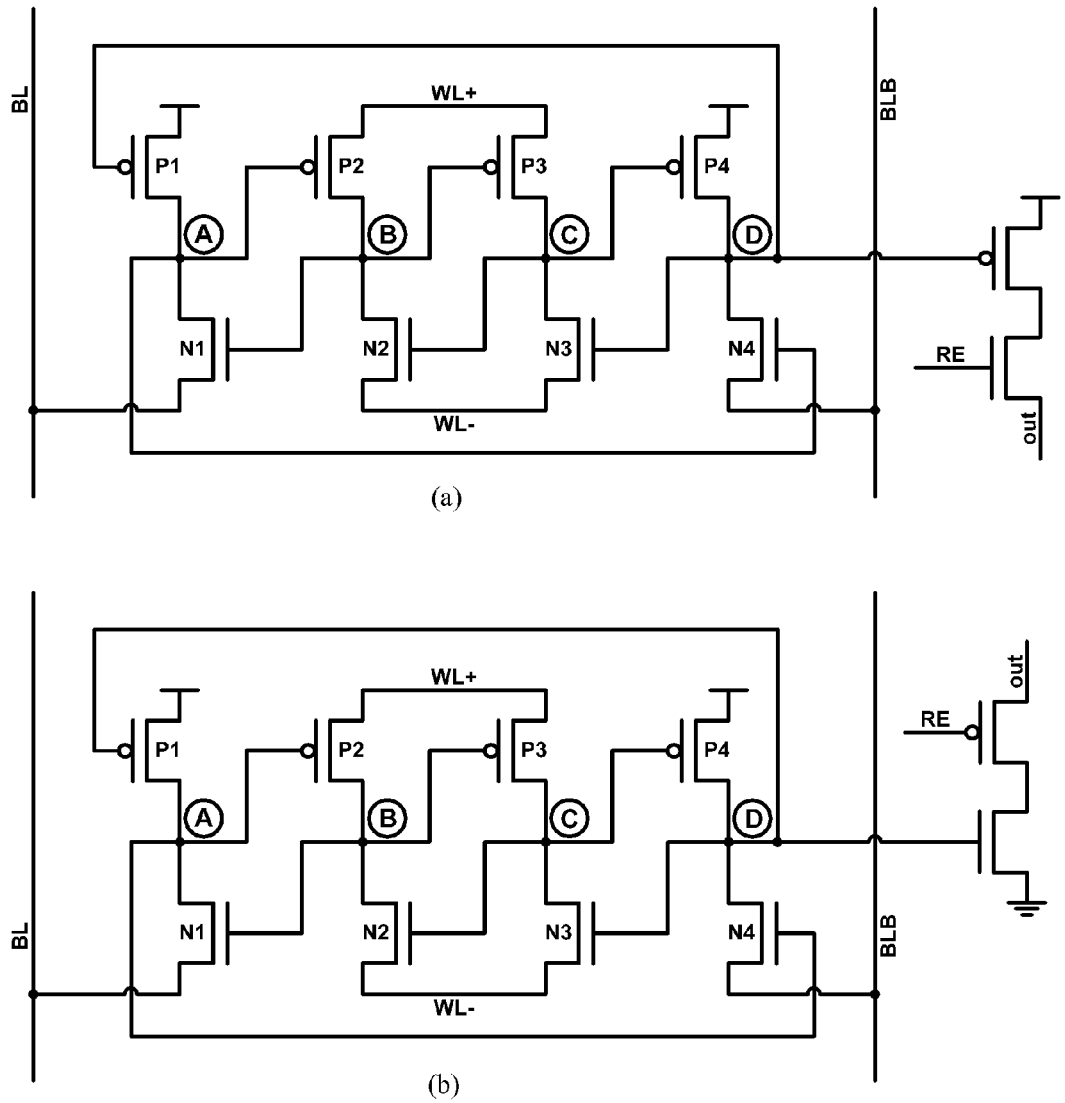

Referring to FIG. 26a, one embodiment of the read assist circuit 2502 is illustrated. In the present embodiment, the read assist circuit 2502 comprises one NMOS transistor $N_{READ}$ and one PMOS transistor $P_{READ}$ coupled in series. The source of transistor $P_{READ}$ is coupled to the power supply VDD and the source of transistor $N_{READ}$ is an output signal out. Transistor $P_{READ}$ is gated by node D and transistor $N_{READ}$ is gated by a read enable signal RE.

Figure 27A:
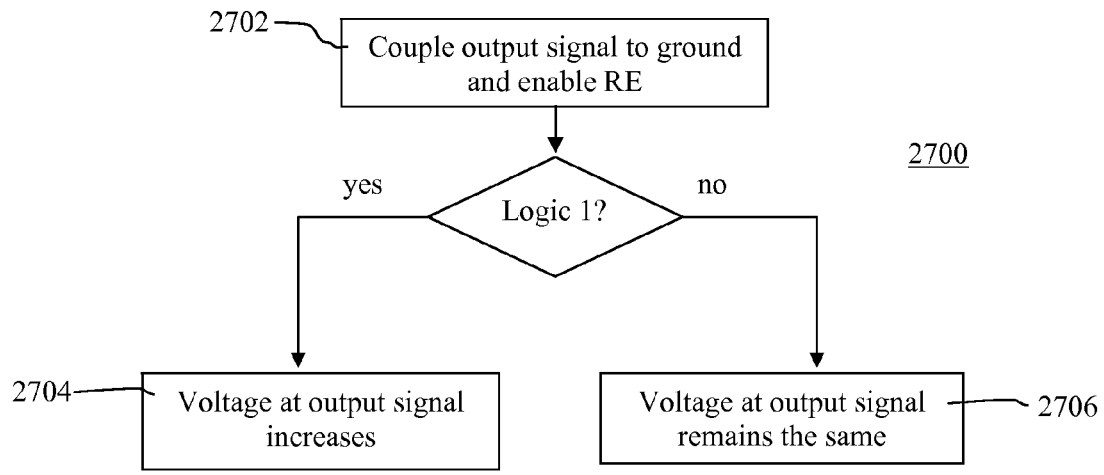

Accordingly, referring to FIG. 27a, a flow chart illustrating the read operation of the 10T DICE SRAM cell 2500 having a read assist circuit as described with reference to FIG. 26a is illustrated generally by numeral 2700. At step 2702, output signal out is precharged to ground potential and the read enable signal RE is turned on. In the present embodiment, the 10 DICE SRAM cell 2500 is defined as holding a logic 1 if nodes A, B, C, D hold a 1, 0, 1, 0, respectively. Therefore, if the 10T DICE SRAM cell 2500 holds a logic 1 then at step 2704 the voltage at the output signal out will increase. If, however, the 10T DICE SRAM cell 2500 holds a logic 0 then at step 2706 the output signal out will remain at ground potential.

It will be appreciated that transistor $P_{READ}$ can be gated by any one of nodes A, B, C or D. However, it should be noted that what represent a logic 1 depends on which node is used. For example, node B will yield similar results to node D. However, if either of nodes A and C are used to gate $P_{READ}$, the output signal out will increase if the 10T DICE SRAM cell 2500 holds a logic 0 and remain at ground potential if it holds a logic 1.

Referring to FIG. 26b, an alternate embodiment of the read assist circuit 2502 is illustrated by numeral 2502'. In the present embodiment, the read assist circuit 2502' comprises one NMOS transistor $N_{READ}$ and one PMOS transistor $P_{READ}$ coupled in series. The source of transistor $N_{READ}$ is coupled to ground potential and the source of transistor $P_{READ}$ is the output signal out. Transistor $N_{READ}$ is gated by node D and transistor $P_{READ}$ is gated by a read enable signal RE.

Figure 27B:
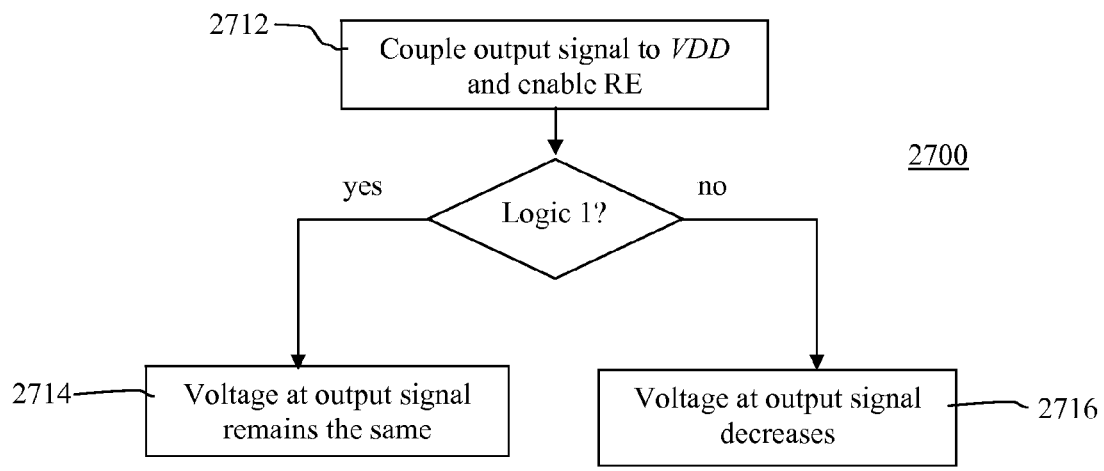
FIG. 27b is a flow chart for the read operation on the cell illustrated in FIG. 26b.

Accordingly, referring to FIG. 27b, a flow chart illustrating the read operation of the 10T DICE SRAM cell 2500 having a read assist circuit as described with reference to FIG. 26b is illustrated generally by numeral 2710. At step 2712, output signal out is precharged to the supply voltage VDD and the read enable signal RE is turned on. In the present embodiment, the 10 DICE SRAM cell 2500 is defined as holding a logic 1 if nodes A, B, C, D hold a 1, 0, 1, 0, respectively. Therefore, if the 10T DICE SRAM cell 2500 holds a logic 1 then at step 2714 the voltage at the output signal out remains at the supply voltage VDD. If, however, the 10T DICE SRAM cell 2500 holds a logic 0 then at step 2716 the output signal out is pulled to ground potential.

Similar to the previous embodiment, it will be appreciated that transistor $N_{READ}$ can be gated by any one of nodes A, B, C or D. However, it should be noted that what represents a logic 1 depends on which node is used. For example, node B will yield similar results to node D. However, if either of nodes A and C are used to gate $N_{READ}$, the output signal out will remain the same if the 10T DICE SRAM cell 2500 holds a logic 0 and get pulled to ground potential if it holds a logic 1.

Both of the embodiments described above provide the same number of NMOS and PMOS transistors, which can be beneficial for circuit layout. However, this need not be the case. For example, in yet an alternate embodiment the read assist circuit 2502 comprises two NMOS transistors $N1_{READ}$ and $N2_{READ}$ coupled in series. The source of transistor $N1_{READ}$ is coupled to ground potential and the drain of transistor $N2_{READ}$ is the output signal out. Transistor $N1_{READ}$ is gated by one of the nodes of the 10T DICE SRAM cell 2500 and transistor $N2_{READ}$ is gated by the read enable signal RE, or vice versa. The output signal out is precharged to the supply voltage VDD.

In yet an alternate embodiment the read assist circuit 2502 comprises two PMOS transistors $P1_{READ}$ and $P2_{READ}$ coupled in series. The source of transistor $P1_{READ}$ is coupled to the supply voltage VDD and the drain of transistor $P2_{READ}$ is the output signal out. Transistor $P1_{READ}$ is gated by one of the nodes of the 10T DICE SRAM cell 2500 and transistor $P2_{READ}$ is gated by the read enable signal RE, or vice versa. The output signal out is precharged to the ground potential.

Figure 28:
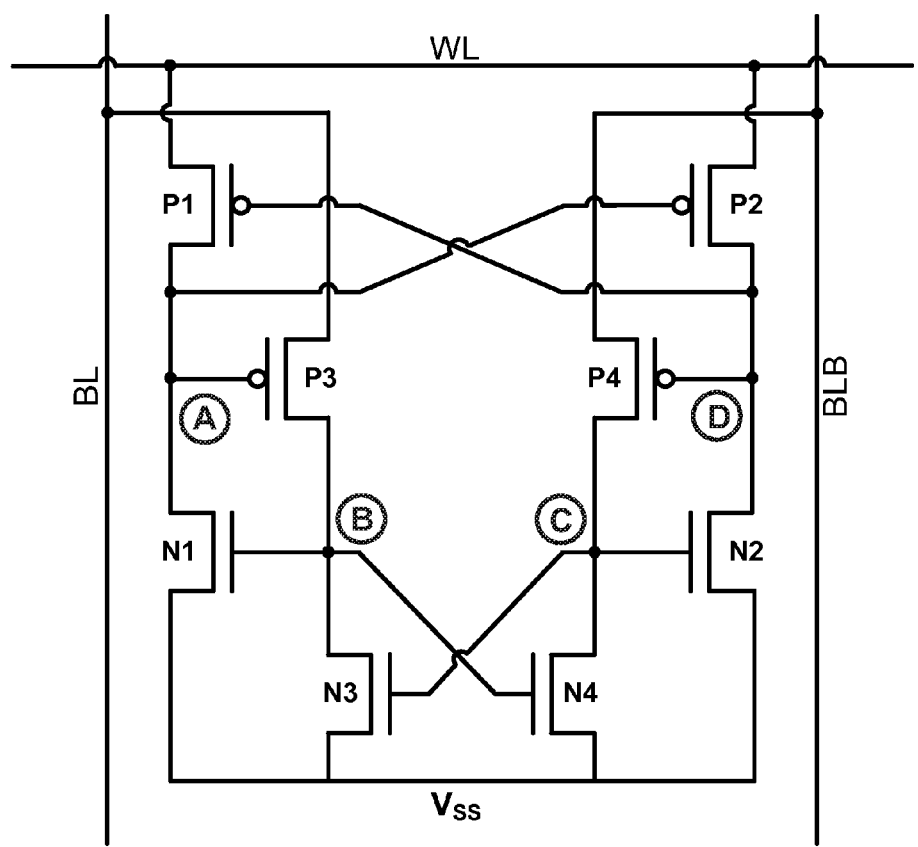
FIG. 28 is a schematic diagram of an alternate configuration for the 8T SRAM illustrated in FIG. 11.

The previous embodiments describe the storage nodes as being coupled to the bitline or wordline through the NMOS transistors and to the power supply through the PMOS transistors. However, it will be appreciated that because of the symmetry of the cells, the opposite is also possible. That is, the storage nodes can be coupled to either the bitline or the wordline through the PMOS transistors and to the power supply through the NMOS transistors. Referring to FIG. 28, an 8T SRAM cell similar to the one described in FIG. 11 is illustrated generally by numeral 2800. As illustrated, the storage nodes A, B, C and D are coupled to power supply VSS via transistors N1, N3, N4 and N2, respectively. Further, the storage nodes A and D are coupled to the wordline WL via transistors P1 and P2, respectively. Storage node B is coupled to bitline BL via transistor P3 and storage node C is coupled to bitline BLB via transistor P4. In the present embodiment, VSS is 0V. Although only the 8T SRAM cell is illustrated, it will be appreciated by a person of ordinary skill in the art that other embodiments can also be implemented in this manner.

Further, although the previous embodiments have been described with a particular configuration of storage node voltages for logic 1 and complementary voltages for logic 0, it will be appreciated that the inverse may also be the case. That is, a storage node configuration described as logic 1 could, instead, be defined as logic 0, and vice versa.

Accordingly, it will be appreciated that all of the embodiments described above provide examples of an SRAM memory cell having fewer transistors than tradition implementation, thereby improving cell size. Further, reducing the number of transistors by removing the dedicated access transistors allows the core configuration of the storage nodes to remain the same, thereby providing a minimal difference in reliability.

Further, although preferred embodiments of the invention have been described herein, it will be understood by those skilled in the art that variations may be made thereto without departing from the spirit of the invention or the scope of the appended claims.

The invention claimed is:

1. A Static Random Access Memory (SRAM) cell comprising a plurality of transistors configured to provide at least a pair of storage nodes for storing complementary logic values represented by corresponding voltages, the transistors comprising:
    at least one bitline transistor configured to selectively couple one of the storage nodes to at least one corresponding bitline, the bitline for being shared by SRAM cells in one of a common row or column;
    at least one wordline transistor configured to selectively couple another of the storage nodes to at least one corresponding wordline, the wordline for being shared by SRAM cells in the other of the common row or column; and
    at least two supply transistors configured to selectively couple corresponding ones of the storage nodes to a supply voltage;
    the bitline transistor being further configured to actively maintain a logic value at the one of the storage nodes and the wordline transistor being further configured to actively maintain a complementary logic value at the other of the storage nodes.

2. The SRAM cell of claim 1, wherein the wordline transistor is coupled at its gate to the one of the storage nodes and the bitline transistor is coupled at its gate to the other of the storage nodes.

3. The SRAM cell of claim 2, wherein the cell comprises a first storage node and a second storage node and:
    the bitline transistor couples the first storage node to the corresponding bitline;
    the wordline transistor couples the second storage node to the corresponding wordline; and
    the two supply transistors couple the first and second storage nodes to the supply voltage.

4. The SRAM cell of claim 3, wherein SRAM cell stores a logic one when the first storage node stores a high voltage and the second node storage node stores a low voltage.

5. The SRAM cell of claim 3, wherein SRAM cell stores a logic zero when the first storage node stores a low voltage and the second node storage node stores a high voltage.

6. The SRAM cell of claim 3, wherein the wordline is configured to act as an access control that can be enabled to selectively couple the first storage node to the bitline for a read operation.

7. The SRAM cell of claim 3 where a combination of a voltage on the wordline and a voltage on the bitline are configured to enable complementary data to be written onto the nodes of the SRAM cell as desired.

8. The SRAM cell of claim 3, wherein the supply voltage is a positive terminal of a supply voltage.

9. The SRAM cell of claim 3, wherein the supply voltage is a negative terminal of a supply voltage.

10. A Static Random Access Memory (SRAM) cell comprising a plurality of transistors configured to provide four storage nodes configured as two pairs of complementary storage nodes for storing complementary logic values represented by corresponding voltages, the transistors comprising:
    two bitline transistors configured to selectively couple a first pair of complementary storage nodes to corresponding bitlines, the bitlines for being shared by SRAM cells in one of a common row or column;
    two wordline transistors configured to selectively couple a second pair of complementary storage nodes to the corresponding wordlines, the wordlines being shared by SRAM cells in the other of the common row or column; and
    four supply transistors configured to selectively couple the four storage nodes to a power supply.

11. The SRAM cell of claim 10, wherein SRAM cell stores a logic one when a first one of the first and second pair of complementary storage nodes stores a high voltage and the second one of the first and pair of complementary node storage nodes stores a low voltage.

12. The SRAM cell of claim 10, wherein SRAM cell stores a logic zero when a first one of the first and second pair of complementary storage nodes stores a high voltage and the second one of the first and pair of complementary node storage nodes stores a low voltage.

13. The SRAM cell of claim 10, wherein the wordline is configured to act as an access control that can be enabled to selectively couple two of the storage nodes to the bitline and complementary bitline for a read operation.

14. The SRAM cell of claim 10 where a combination of a voltage on the wordline, a voltage on the bitline and complementary bitline are configured to enable accessing the storage nodes for a write operation.

15. The SRAM cell of claim 10, wherein the supply voltage is a positive terminal of a supply voltage.

16. The SRAM cell of claim 10, wherein the supply voltage is a negative terminal of a supply voltage.

17. A Static Random Access Memory (SRAM) cell comprising a plurality of transistors configured to provide four complementary storage nodes as two pairs of complementary storage nodes for storing complementary logic values represented by corresponding voltages, the transistors comprising:

two bitline transistors configured to selectively couple two complementary storage nodes to corresponding bitlines, the bitlines for being shared by SRAM cells in one of a common row or column;

four wordline transistors configured to selectively couple the remaining two complementary storage nodes to corresponding wordlines, the wordlines shared by SRAM cells in the other of a common row or column; and the two supply transistors coupling corresponding ones of the two complementary storage nodes to the supply voltage.

18. The SRAM cell of claim 17, wherein the SRAM cell stores a logic one when a first one of the first and second pair of complementary storage nodes stores a high voltage and a second one of the first and second pair of complementary node storage nodes stores a low voltage.

19. The SRAM cell of claim 17, wherein the SRAM cell stores a logic zero when a first one of the first and second pair of complementary storage nodes stores a high voltage and a second one of the first and second pair of complementary node storage nodes stores a low voltage.

20. The SRAM cell of claim 17 where a combination of the wordline and bitlines are configured to enable accessing one storage node for a read operation.

21. The SRAM cell of claim 20, wherein the wordlines are configured to act as an access control signals that can be enabled to selectively couple two storage node to two bitlines for a write operation.

* * * * *